United States Patent [19]

Ozawa

[11] Patent Number: 5,477,068
[45] Date of Patent: Dec. 19, 1995

[54] NONVOLATILE SEMICONDUCTOR MEMORY DEVICE

[75] Inventor: Takanori Ozawa, Kyoto, Japan

[73] Assignee: Rohm Co., Ltd., Kyoto, Japan

[21] Appl. No.: 32,119

[22] Filed: Mar. 17, 1993

[30] Foreign Application Priority Data

Mar. 18, 1992 [JP] Japan .................................. 4-062255
Mar. 18, 1992 [JP] Japan .................................. 4-062256

[51] Int. Cl.$^6$ .............................................. H01L 29/788
[52] U.S. Cl. .................... 257/214; 365/182; 365/185.18;
257/314; 257/315; 257/316; 257/319; 257/320;
257/366
[58] Field of Search ....................... 365/185, 900,
365/182; 257/314, 315, 316, 319, 320,
366

[56] References Cited

U.S. PATENT DOCUMENTS

| | | | |
|---|---|---|---|
| 4,907,197 | 3/1990 | Uchida | 365/185 |
| 5,041,886 | 8/1991 | Lee | 365/185 |
| 5,045,488 | 9/1991 | Yeh | 365/185 |
| 5,091,882 | 2/1992 | Naruke | 365/185 |
| 5,101,250 | 3/1992 | Arima et al. | 365/185 |
| 5,194,925 | 3/1993 | Ajika et al. | 365/185 |
| 5,235,544 | 8/1993 | Caywood | 365/185 |
| 5,241,499 | 8/1993 | Camerlenghi | 365/185 |
| 5,258,949 | 11/1993 | Chang et al. | 365/185 |
| 5,262,987 | 11/1993 | Kojima | 365/185 |
| 5,267,194 | 11/1993 | Jang | 365/185 |
| 5,338,952 | 8/1994 | Yamauchi | 365/185 |
| 5,402,374 | 3/1995 | Tsuruta et al. | 257/321 |

FOREIGN PATENT DOCUMENTS

| | | |
|---|---|---|
| 63-154698 | 1/1990 | Japan . |
| 2-87676 | 3/1990 | Japan . |

OTHER PUBLICATIONS

"Characteristics of a New EPROM Cell Structure With a Sidewall Floating Gate", published in IEEE Transactions on Electron Devices, vol. ED–34, No. 6, Jun. 1987 by Y. Mizutani and K. Makita.

Nikkei Microdevices, May 1990, pp. 72–77.

*Primary Examiner*—Viet Q. Nguyen
*Attorney, Agent, or Firm*—Steven M. Rabin

[57] ABSTRACT

A pair of impurity regions are formed at a specified interval in a semiconductor substrate. A channel region is defined between the impurity regions. A select gate is provided on the channel region, and a sidewall for holding electric charge is provided along a side of the select gate. A tunnel insulating film is interposed between the sidewall for holding electric charge and the channel region. An insulating film covers the sidewall for holding electric charge. A control gate is provided on the insulating film lying over the sidewall. In such a structure, since the select gate can have a large cross-sectional area, speed-up of the reading can be attained.

24 Claims, 14 Drawing Sheets

NONVOLATILE SEMICONDUCTOR MEMORY DEVICE

BACKGROUND OF THE INVENTION

1. Field of the Invention

The present invention relates to a nonvolatile semiconductor memory device such as an EEPROM (Electrically Erasable/Programmable Read Only Memory).

2. Description of the Prior Art

As to a memory transistor in an EEPROM, conventionally, a transistor which has a following gate structure is applied. More specifically, an electrically insulated floating gate is formed over a tunnel oxide film superposed on a surface of a semiconductor substrate, and a control gate is further superposed with an underlying insulating film above the floating gate. For example, in an N-channel transistor, hot electrons produced in the vicinity of a drain are caused to pass through the tunnel oxide film and be injected into the floating gate to write data. Then, electrons accumulated in the floating gate are pulled out from a source side to erase data. The threshold voltage of the transistor varies from a state where electrons are accumulated in the floating gate to a state where no electrons are accumulated therein. Then, a sense voltage of a medium value is applied to the control gate to examine whether the transistor turns on or maintains an OFF-state, and eventually the data reading is effected.

EEPROMs utilizing a memory transistor having the floating gate as mentioned above can be classified into a full-future type and a flash type. As to the full-future type, a select transistor is provided in a memory transistor of each cell to write, erase or read data in or from each cell independently. As to the flash type, the data writing and the data reading are carried out in each individual cell while the erasing is carried out in all the cells en bloc.

However, since the full-future type one has a select transistor provided in each individual cell, each cell accordingly covers a larger area, which causes a difficulty in high integration. Hence, in recent years, development of the flash type one has been advanced more.

Typically, a memory transistor in the flash type EEPROM is of stack gate structure as shown in FIG. 13. As can be seen, a P-well 62 is formed in an N-type silicon substrate 61, and a tunnel oxide film 63, a floating gate 64, an insulating film 65, and a control gate 66 are laminated in this order on and above the P-well 62. In the P-well 62 on opposite sides of the tunnel oxide film 63, an N$^+$-type source diffusion layer 67 and an N$^+$-type drain diffusion layer 68 are formed. Moreover, a P$^+$-type diffusion layer 69 is formed around the drain diffusion layer 68. The P$^+$-type diffusion layer is useful to concentrate an electric field in the boundary region between the drain diffusion layer 68 and the P-well 63 so as to enhance a hot electron producing efficiency. In the vicinity of the source diffusion layer 67, an N$^-$-type diffusion layer 70 is formed. The N$^-$-type diffusion layer 70 softens a variation in an impurity concentration in the boundary region between the source diffusion layer 67 and the P-well 62 so as to make a structure of high sustain voltage in the boundary region.

In such a structure, applying positive high level voltage to a control gate G and a drain D and applying ground potential to a source S, hot electrons are produced in the vicinity of the drain diffusion layer 68. The hot electrons pass through the tunnel oxide film 63 and are injected into the floating gate 64. In this way, the data writing is attained.

In erasing data, ground potential is applied to the gate G, and erasing voltage is applied to the source S. Consequently, electric charges in the floating gate 64 are pulled out into the source diffusion layer 67 according to a tunnel effect of the Fowler-Nordheim type, and thus the data erasing is accomplished.

A threshold of the transistor varies between two levels depending upon existence or absence of electrons in the floating gate 64. In reading data, a sense voltage having a voltage value in the middle of the two levels of the threshold is applied to the gate G. Then, by monitoring if a path between the source and drain is conductive, it can be found whether data is being written or being erased, and thus, the data reading is accomplished.

In the EEPROM, memory transistors as mentioned above are disposed in a matrix manner, where sources S of those transistors are commonly connected. In erasing data, the ground potential is applied to all word lines connected to gates G while positive voltage is applied to the sources S commonly connected, and thus, the data erasing is performed in all the cells en bloc. Such a stack gate structure flash type EEPROM is advantageous in integration because a single cell includes a single transistor therein.

However, in order to erase data stored in all the cells on the substrate (or all the cells in the P-well 62) en bloc, the total erasing time must be set relatively long, allowing for a cell which requires the longest time to erase signal charges. For this reason, in a cell where signal charges are erased relatively quickly, signal charges are excessively pulled out to result in overerasure so that positive charges are accumulated in a floating gate of a memory transistor in this cell. The overerasure causes a threshold of the transistor to vary from cell to cell, and this causes instability in the reading operation. In a memory transistor of a cell where overerasure has occurred, for example, a channel is formed even under a non-selected condition due to positive charges accumulated in the floating gate, and there arises the problem that current undesirably flows between the source and drain. Hence, the reading of data stored in a target cell is unreliable.

An exemplary flash type EEPROM overcoming the above-mentioned disadvantage is proposed, in which a transistor having an SISOS (Sidewall Select-Gate on the Source Side) structure as illustrated in a simple manner in FIG. 14 is applied to a memory transistor (NIKKEI MICRODEVICES, MAY 1990, pp. 72–77). In FIG. 14, corresponding components to those in FIG. 13 are designated by like reference numerals. In this structure, a sidewall spacer (SWS) of relatively small cross-sectional area is formed in self-alignment manner on a sidewall of a gate consisting of a floating gate 64 and the like on the side of a source diffusion layer 67. The SWS is used as a select gate 71 to select a cell. In reading data, positive voltage is applied to the select gate 71 to form a channel in the P-well 62 just below the select gate 71.

In such a structure, since application of voltage to the select gate 71 permits an assured selection of a cell from which data is to be read, the data reading from non-selected cells can be prevented and reliability of the reading can be secured even when the overerasure has caused a slight variation in the threshold. Additionally, since a transistor formation region occupies no excessively large area, good integration is expected.

However, in a memory device to which a transistor of an SISOS structure as mentioned above is applied, to the select gate 71 has a high electrical resistance due to its relatively small cross-sectional area. This causes the problem that speed-up of the reading is inhibited. It is not acceptable to enlarge the cross-sectional area of the select gate 71 to avoid such a disadvantage because this would enlarge an area of the substrate and would be counter to the demand for a higher integration.

Another example of the prior art technology is shown in FIG. 15. A memory transistor used in a prior art nonvolatile semiconductor memory device is named "trap type". N$^+$-type high concentration impurity regions are formed in a P-type semiconductor substrate 161 to define a source diffusion layer 162 and a drain diffusion layer 163. In a surface of the semiconductor substrate 161 between them, is an insulating film 164 which can trap electrons or holes. A gate 165 is formed on the insulating film 164. The insulating film 164 is made with the so-called ONO film; the insulating film 164 is composed of a sandwich construction in which a nitride film 164C is interposed between a tunnel oxide film 164A and a top oxide film 164B.

In a writing data, writing voltage $V_p$ is applied between the gate 165 and the substrate 161, so that the gate 165 becomes electrically positive. This allows electrons to pass through the tunnel oxide film 164A according to direct tunneling from the substrate 161, and they are injected into the nitride film 164C. In a data written state where the electrons are trapped in the nitride film 164C, a threshold voltage required to turn the memory transistor on takes a high level.

In an erasing data, erasing voltage $V_E$ is applied between the gate 165 and the substrate 161 so that the gate 165 becomes electrically negative. In this way, electrons in the nitride film 164C are pulled out into the substrate 161, passing through the oxide film 164A by direct tunneling. In a data erased state where no electrons are trapped in the nitride film 164C, the threshold voltage to turn the memory transistor on has a low level.

In order to read data, a sense voltage having an intermediate voltage level between the above two threshold levels in the data written and data erased states, is applied to the gate 165 while it is monitored whether the memory transistor turns on or maintains its OFF-state.

Such trap-type memory transistor EEPROMs can be classified into a full-future type and a flash type.

As to the full-future type one, since it has a select transistor in each individual cell, a cell area becomes large, and this causes a difficulty in high integration. Hence, in recent years, development of the flash ROM has been advanced more.

In order to erase data stored in all the cells in the substrate en bloc, however, the total erasing time must be set relatively long, allowing for a cell which requires the longest time to erase signal charges. For this reason, in a cell where signal charges are erased relatively quickly, signal charges are excessively pulled out to result in overerasure so that positive charges are accumulated in the insulating film 164 of a memory transistor in this cell. The overerasure causes a threshold of the transistor to vary from cell to cell, and this causes instability in reading a memory transistor of a cell where overerasure is caused, for example, a channel is formed even under non-selected condition due to positive charges accumulated in the insulating film, and there arises the problem that current undesirably flows between the source and drain. Hence, the reading of data stored in a target cell is unreliable.

3. Description of the Related Art

A way of overcoming the disadvantage as has been described is to employ with the "trap-type" memory device the above-stated SISOS structure which seems desirable to apply to a floating gate type EEPROM. Such a modified trap-type memory device is shown in a simple way in FIG. 16. In FIG. 16, like reference numerals designate corresponding components to those in FIG. 15.

In such a structure, a sidewall spacer (SWS) of relatively small cross-sectional area is formed in self-alignment manner on a sidewall of a gate comprising a insulating film 164 and the like on the side close to a source diffusion layer 162, and the SWS is used as a select gate 171 to select a cell. In reading data, positive voltage is applied to the select gate 171 to form a channel in a semiconductor substrate 161 just below the select gate 171.

In such a structure, since application of a voltage to the select gate 171 permits an assured selection of a cell from which data is to be read, the data reading from non-selected cells can be prevented and reliability of the reading can be secured even when overerasure causes a slight variation in a threshold. Additionally, since a transistor formation region occupies no excessively large area, good integration is expected.

However, in a memory device to which a transistor of an SISOS structure as mentioned above is applied, since to the select gate 171 has a relatively small cross-sectional area, the select gate 171 is relatively high in electrical resistance, and as a result, there arises the problem that speed-up of the reading is inhibited. It is not acceptable to enlarge the cross-sectional area of the select gate 171 to avoid such a disadvantage because such a conduction leads to an increase in a substrate area, and it goes counter to the demand for a higher integration.

Employing either of the structures in FIGS. 15 and 16, direct tunneling from the substrate 161 is utilized to carry out the writing and the erasing, and therefore, a tunnel oxide film 164A must be thinned to some extent. However, using such a thin tunnel oxide film 164A, accumulated electric charges are likely to dissipate, and there arises the drawback that data retention is degraded.

A procedure to overcome this disadvantage is forming the tunnel oxide film 164A with a certain thickness, producing hot electrons, which can pass through a thick oxide film, in the vicinity of the drain diffusion layer 163, and injecting the hot electrons into the oxide film to conduct the data writing, or utilizing the Fowler-Nordheim tunnel effect to conduct the data erasing. However, electric charges trapped in an insulating film remain, and eventually, electrons are injected only into a region close to the drain diffusion layer 163 in the nitride film 164C. This local electron injection cannot cause so great a variation in threshold of a memory transistor, and this makes the data storing unstable.

SUMMARY OF THE INVENTION

An object of the present invention is to solve technological problems as mentioned above so that the data reading can be well performed and to provide a nonvolatile semiconductor memory device advantageous in high integration.

A nonvolatile semiconductor memory device according to the present invention includes two transistors formed on a semiconductor substrate: a memory transistor for storing data in a nonvolatile manner by injecting/releasing electric charges via a tunnel insulating film into/from a electric charge retaining layer, and a select transistor for selecting the memory transistor. In the semiconductor substrate, a pair of impurity regions, which act as a drain and a source for both the memory transistor and the select transistor, is formed with a channel region being interposed therebetween. On the channel region of the semiconductor substrate, the select gate of the select transistor is formed and on the drain side thereof, a sidewall structure for retaining an electric charge is provided corresponding to the above mentioned electric charge retaining layer. A control gate of the memory transistor is provided in the vicinity of the sidewall for retaining an electric charge, with the insulating film being interposed.

According to such a construction, the select gate of the select transistor is formed over the relatively wide region in the channel region and on the side portion thereof, the side wall for retaining an electric charge is formed. Accordingly, the select gate, to which voltage for selecting the memory transistor is applied, can have a relatively big cross-sectional area. Thus, the electrical resistance of the select gate is low enough to read stored data at high-speed.

In addition, both the memory transistor and the select transistor are formed in one transistor forming region. Therefore, it is advantageous in high integration since a memory device can be formed in a small area.

The foregoing and other objects, features and effects of the present invention will become more fully apparent in the following detailed description if taken in conjunction with the accompanying drawings.

DESCRIPTION OF THE PREFERRED EMBODIMENTS

Figure 1:
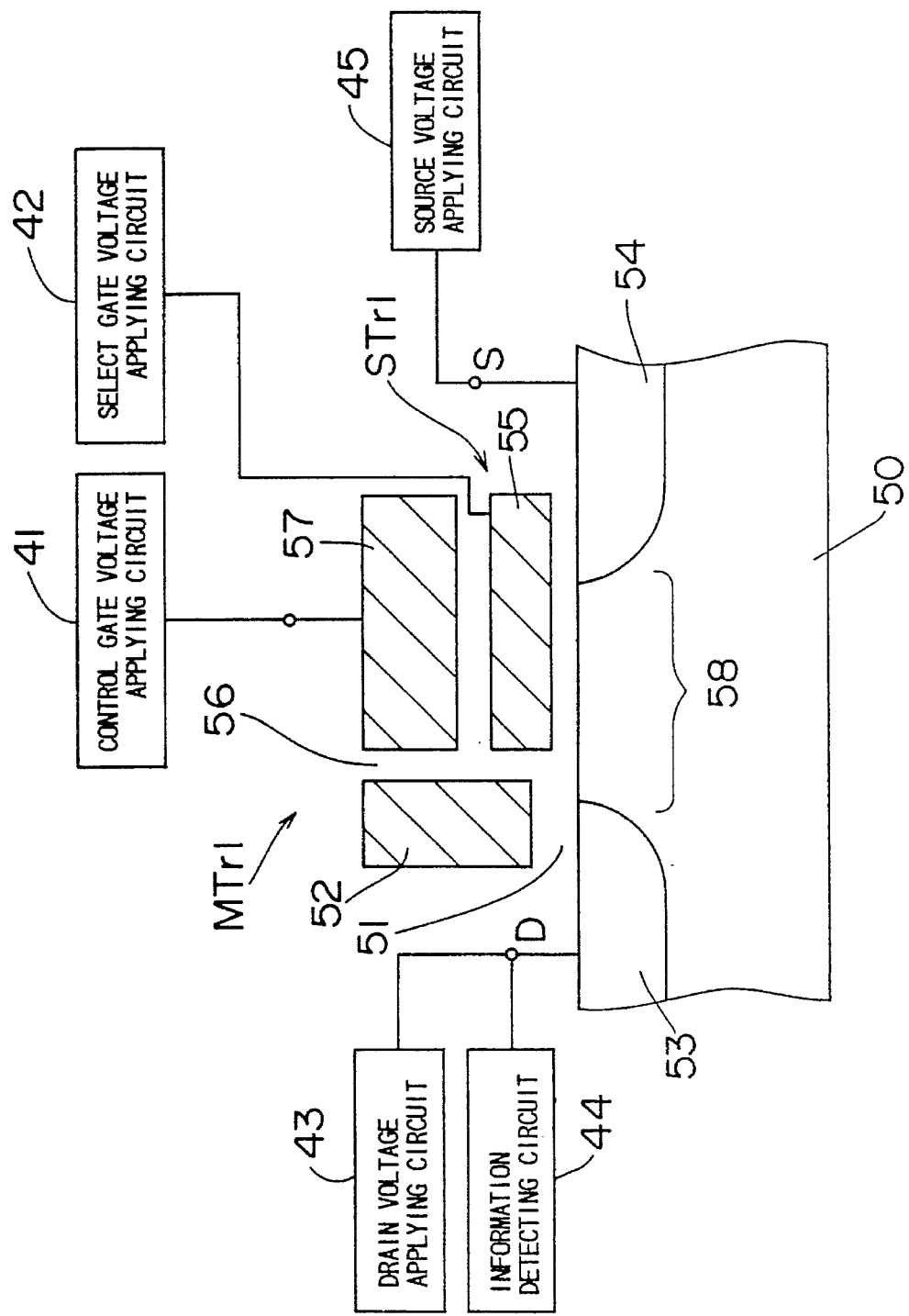
FIG. 1 is a schematic sectional view showing a structure based upon the theory of a nonvolatile semiconductor memory device of a first preferred embodiment according to the present invention.

FIG. 1 is a sectional view showing a structure based upon the theory of a nonvolatile semiconductor memory device of a first preferred embodiment according to the present invention. On a semiconductor substrate 50 there are provided two transistors: a memory transistor MTr1 for storing data in a nonvolatile manner by injecting/releasing electric charges via a tunnel insulating film into/from a floating gate, and a select transistor STr1 for selecting the memory transistor MTr1. In the semiconductor substrate 50, a first impurity diffusion region 53 and a second impurity diffusion region 54 are formed with a channel region 58 interposed therebetween, and the first and second impurity diffusion regions 53 and 54 act as a drain D and a source S for both the memory transistor MTr1 and the select transistor STr1. On the channel region 58, a select gate 55 of the select transistor STr1 is formed.

A sidewall structure forming sidewall gate 52, and acting as the floating gate, is provided in an electrically insulated condition along a side of the select gate 55, close to the drain D. In the vicinity of the sidewall gate 52, a control gate 57 of the memory transistor MTr1 is provided with an insulating film 56 interposed between them.

The control gate 57 is connected to a control gate voltage applying circuit 41 while the select gate 55 is connected to a select gate voltage applying circuit 42. The first impurity diffusion region 53 is connected to a drain voltage applying circuit 43 and a data detecting circuit 44. The second impurity diffusion region 54 is connected to a source voltage applying circuit 45.

It is now assumed that the semiconductor substrate 50 is of a P-type and the first and second impurity diffusion regions 53 and 54 are of an $N^+$-type. If electrons are retained in the sidewall gate 52, an inversion layer does not easily appear in a surface of the semiconductor substrate 50 just below the gate 52. This state, for example, corresponds to a logic "1". If electrons are not retained in the sidewall gate 52, an inversion layer appears relatively easily in the surface of the semiconductor substrate 50 just below the gate 52. This state, for example, corresponds to a logic "0".

In writing data, the control gate voltage applying circuit 41 applies high level voltage (e.g., 12 V) to the control gate 57, and the select gate voltage applying circuit 42 applies a high level voltage (e.g., 12 V) to the select gate 55. The drain voltage applying circuit 43 applies positive writing voltage Vp (e.g., 5 V) to the first impurity diffusion region 53, and the source voltage applying circuit 45 applies a ground potential to the second impurity diffusion region 54.

Thus, electrons from the impurity diffusion region 54 are accelerated toward the impurity diffusion region 53. Hot electrons produced in the vicinity of the sidewall gate 52 are injected into the gate 52. Thus, the writing of the data "1" is effected.

The writing voltage $V_p$ is preferably selected to have a level at which a channel formed in a channel region 58 extends beyond under the select gate 55 to a position which does not reach the first impurity diffusion region 53. Then, an electric field is concentrated in a region just under the sidewall gate 52, and numerous hot electrons are produced. This allows the high speed writing of data.

In erasing data, the control gate voltage applying circuit 41 applies a low level voltage (e.g., 0 V) to the control gate 57, and the select gate voltage applying circuit 42 applies a low level voltage (e.g., 0 V) to the select gate 55. The drain voltage applying circuit 43 applies a positive erasing voltage $V_E$ (e.g., 12 V) to the first impurity diffusion region 53.

In this way, electrons in the sidewall gate 52 are pulled out into the impurity diffusion region 53, passing through the tunnel insulating film 51. Thus, the stored data becomes "0", and the erasing of data is effected.

In reading data, the control gate voltage applying circuit 41 applies a specified sense voltage $V_{SENSE}$ (e.g., 5 V) to the control gate 57. The sense voltage $V_{SENSE}$ allows an inversion layer to appear just under the sidewall gate 52 when the stored data is "0" while it cannot allow the inversion layer to appear in that portion when the stored data is "1". On the other hand, the select gate voltage applying circuit 42 applies a high level voltage (e.g., 5 V) to the select gate 55 to make an inversion layer in a surface of the semiconductor substrate 50 just below the select gate 55. Moreover, the source voltage applying circuit 45 applies a ground potential to the impurity diffusion region 54.

In this state, the drain voltage applying circuit 43 applies a positive voltage Vcc to the impurity diffusion region 53 while the data detecting circuit 44 detects a drop of a potential at the impurity diffusion region 53. If the stored data is "1", a path between the pair of the impurity diffusion regions 53 and 54 is interrupted, and therefore, a potential at the impurity diffusion region 53 does not change. On the other hand, if the stored data is "0", a path between the pair of the impurity diffusion regions 53 and 54 is conductive, the potential at the impurity diffusion region 53 drops to the ground potential applied to the impurity diffusion region 54. Thus, by making the data detecting circuit 44 monitor the drop of the potential at the impurity diffusion region 53, the reading of the stored data is effected.

As mentioned above, in the memory device in this embodiment, the select gate 55 of the select transistor STr1 is formed in a relatively large area above the channel region 58, and the sidewall gate 52 on one side of the gate 55 functions as a floating gate. That is, no voltage is applied to the sidewall gate 52 having a small cross-sectional area, which is simply used for an accumulation of electric charges. Thus, there arises no problem if the sidewall gate 52 having a small cross-sectional area has a high resistance value. On the other hand, the select gate 55, to which a voltage for selecting the memory transistor MTr1 is applied, has a relatively large cross-sectional area, and therefore, the select gate 55 can have a sufficiently small resistance value. Thus, high speed reading can be effected.

Additionally, two transistors, the memory transistor MTr1 and the select transistor STr1, are formed in a single transistor formation region. This allows a memory device to be formed in a region of a small area, and it is advantageous for production of highly integrated devices.

Figure 2:
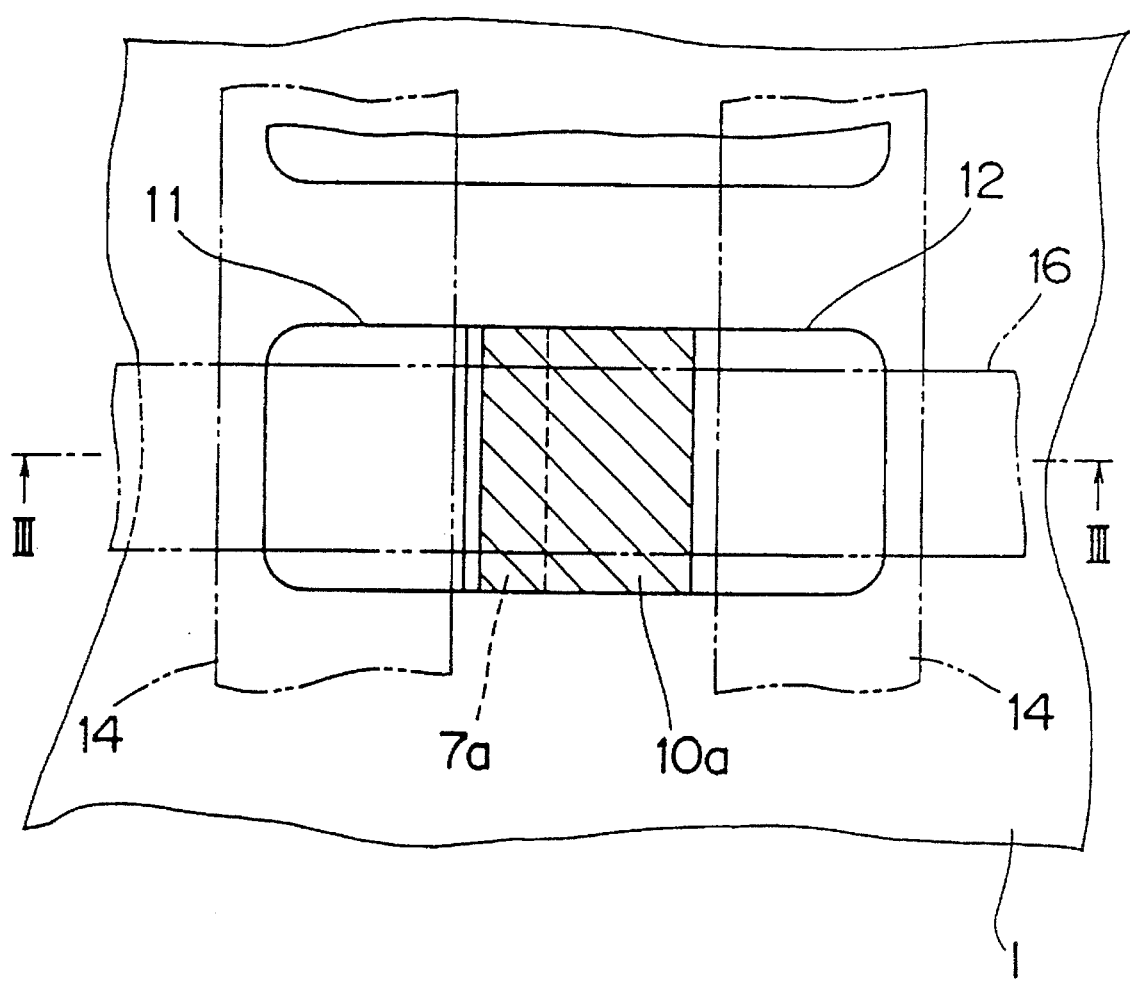
FIG. 2 is a plan view showing a cell configuration of an EEPROM of a second preferred embodiment according to the present invention.
Figure 3:
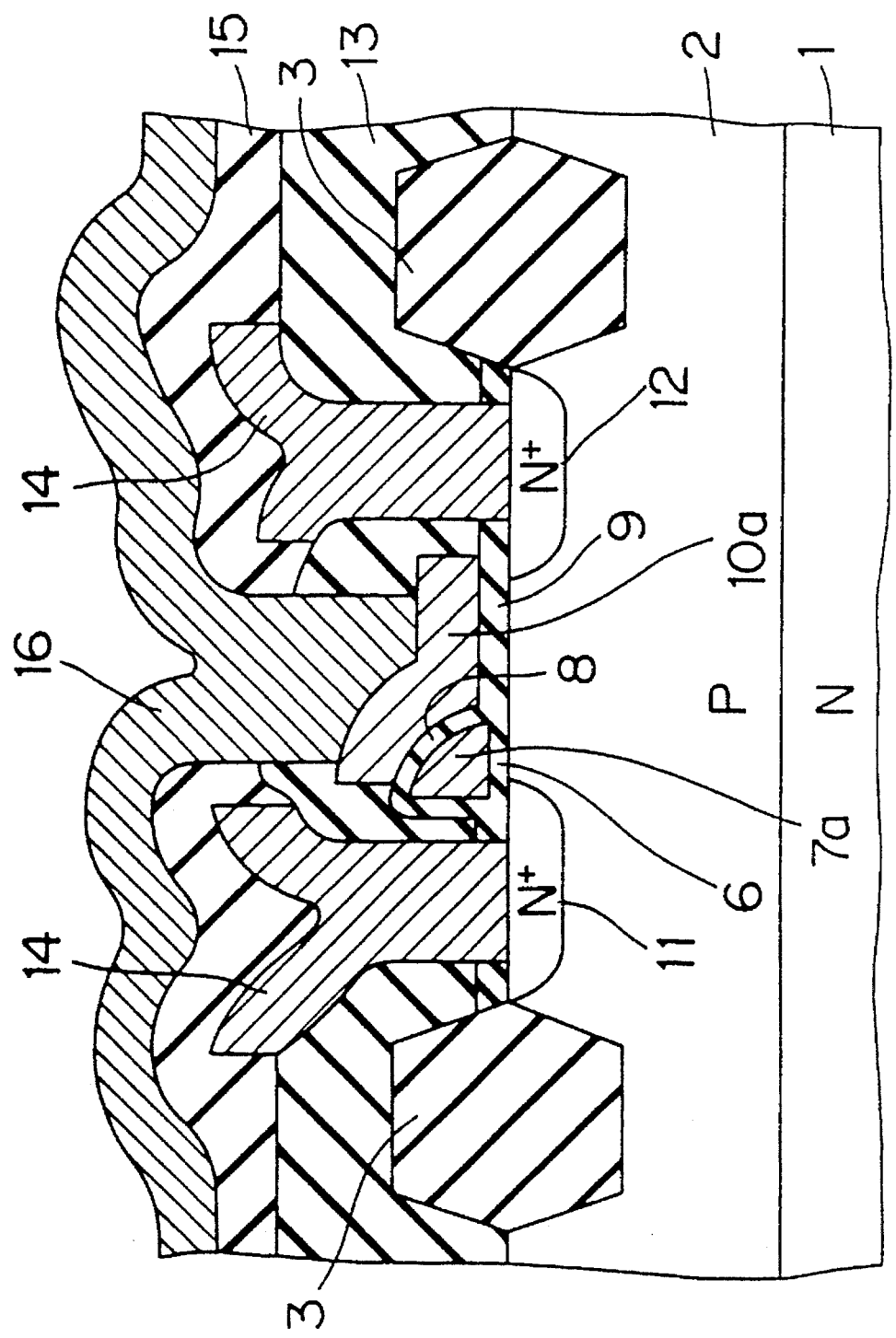
FIG. 3 is a sectional view taken along the line III—III of FIG. 2.

FIG. 2 is a plan view of a memory cell of an EEPROM of a second preferred embodiment of a nonvolatile semiconductor memory device according to the present invention, and FIG. 3 is a sectional view taken along the line III—III of FIG. 2. A P-well 2 formed in an N-type silicon substrate 1 is separated in parts corresponding to specified element formation regions by a field oxide film 3. In each of the separated element formation regions, an N$^+$-type drain diffusion layer 11 and an N$^+$-type source diffusion layer 12 are formed.

In the channel region between the drain diffusion layer 11 and the source diffusion layer 12, a long and narrow floating gate 7a is formed in the vicinity of the drain diffusion layer 11, with a tunnel oxide film 6 interposed between the channel region and the floating gate 7a. In an area of the channel region close to a source, a common gate 10a is formed on a gate oxide film 9 superposed upon the channel region, and the common gate 10a extends up to a region above the floating gate 7a, with an insulating film 8 interposed between them.

In FIGS. 2 and 3, the nonvolatile semiconductor memory device further includes a metal wiring 14 electrically connected to the drain diffusion layer 11 and the source diffusion layer 12, a metal wiring 16 electrically connected to a common gate 10a, and layer insulating films 13 and 15.

In this embodiment, a single memory cell includes a memory transistor and a select transistor in a single transistor region. Specifically, the drain diffusion layer 11 and the source diffusion layer 12 act as a drain and a source for each of those transistors. A gate of the memory transistor consists of the above-mentioned tunnel oxide film 6, the floating gate 7a, the insulating film 8 and the common gate 10a, and one side portion of the common gate 10a close to the drain serves as a control gate. The gate of the select transistor (corresponding to a select gate) is formed of the gate oxide film 9 and the other side portion of the common gate 10a close to the source. The above-mentioned floating gate 7a consists of a gate formed like a sidewall structure along a side of the gate of the select transistor.

Figure 4:
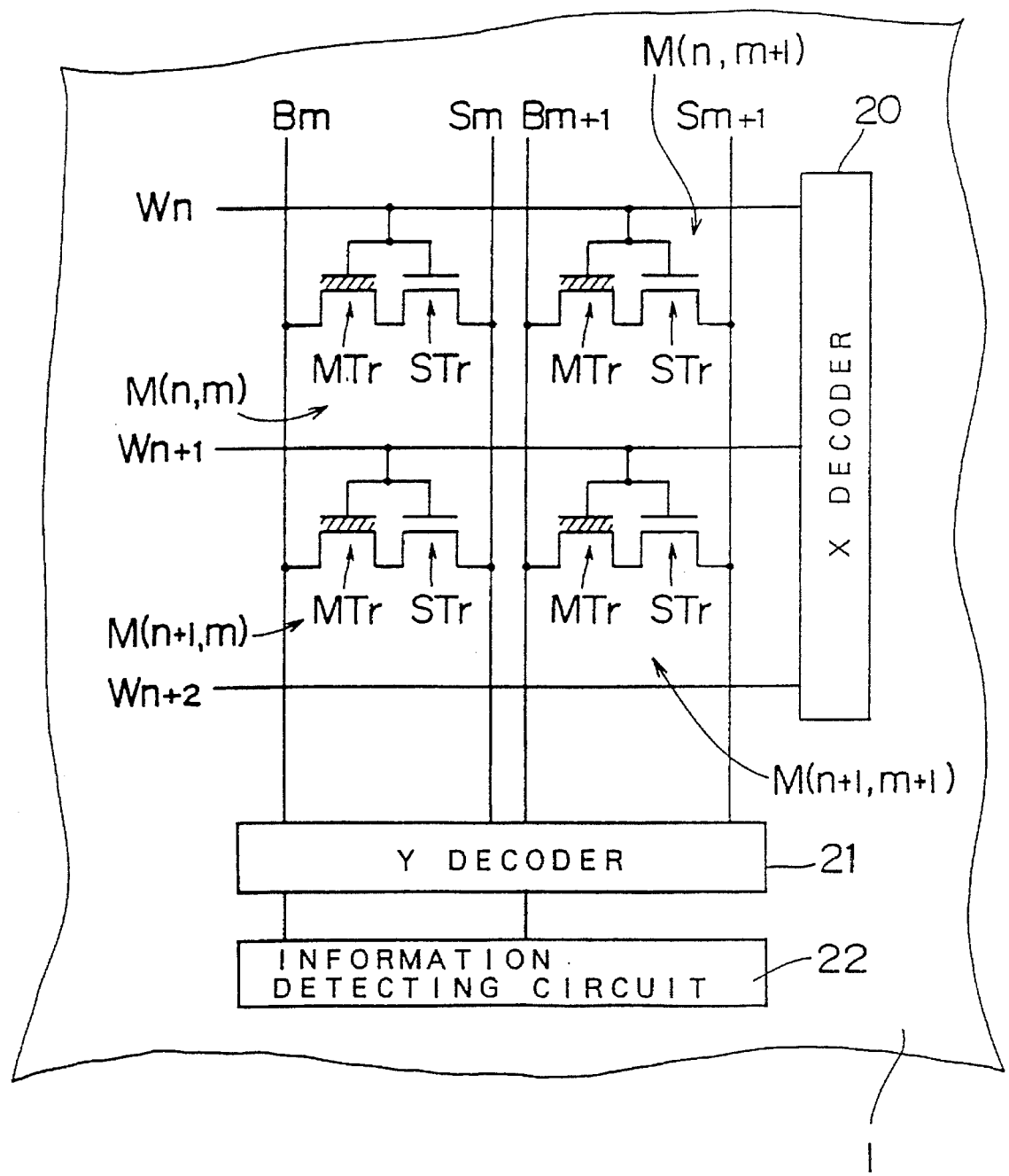
FIG. 4 is a electrical circuit diagram partially showing an equivalent circuit of the EEPROM of the second preferred embodiment.

FIG. 4 is an electrical circuit diagram partially showing an equivalent circuit of an EEPROM of this embodiment. A single memory cell is comprised of the memory transistor MTr and the select transistor STr, and such memory cells are arranged in a matrix manner. The common gate 10a for both the transistors MTr and STr is connected to corresponding one of word lines $W_n$, $W_{n+1}$, and $W_{n+2}$. The memory transistor MTr has its drain (the drain diffusion layer 11) connected to a corresponding one of bit lines $B_m$ and $B_{m+1}$, and the select transistor STr has its source (the source diffusion layer 12) connected to a corresponding one of source lines $S_m$ and $S_{m+1}$. The word lines $W_n$, $W_{n+1}$ and $W_{n+2}$ are selected by an X decoder 20, and the source lines $S_m$ and $S_{m+1}$ are selected by a Y decoder 21. The bit lines $B_m$ and $B_{m+1}$ are selected by the Y decoder 21. Variations in potential of the bit lines $B_m$ and $B_{m+1}$ can be monitored by the data detecting circuit 22.

Writing data in a memory cell M (n, m) is performed as follows: The Y decoder 21 applies writing voltage $V_p$ (e.g., 5 V) to the bit line $B_m$, and the X decoder 20 applies voltage of high level (e.g., 12 V) to the word line $W_n$. The Y decoder 21 applies ground potential to the source line $S_m$. The Y decoder 21 causes the bit lines $B_{m+1}$ and the source line $S_{m+1}$ to be in disconnection or applies ground potential to them so as to prevent writing in another memory cell M (n, m+1) which, commonly to the memory cell M (n, m), is connected to the word line $W_n$. As to the remaining memory cells M (n+1, m) and M (n+1, m+1), the X decoder 20 applies a ground potential or a voltage of low level (e.g., 0 V) to the word line $W_{n+1}$ to turn the select transistor STr off, and thus writing in each memory cell is prevented.

In the selected memory cell M (n, m), hot electrons are injected into the floating gate 7a as in the following way. The writing voltage $V_p$ is applied to the drain diffusion layer 11, the ground potential is applied to the source diffusion layer 12, and the common gate 10a reaches a high level. At this time a channel is formed from the source diffusion layer 12 toward the drain diffusion layer 11. Appropriately setting the writing voltage $V_p$, the channel extends beyond under the select transistor STr (i.e., just below the gate oxide film 9 on the right side portion of the common gate 10a in FIG. 3) up to a position which does not reach the drain diffusion layer 11. Then, an electric field is concentrated in a region just under the floating gate 7a, and numerous hot electrons are produced. Although part of the hot electrons flows into the drain diffusion layer 11, another part is accelerated by the electric field in the common gate 10a and injected into the floating gate 7a after passing through the tunnel oxide film 6. In this way, data writing is effected. In such a writing situation, the threshold to turn the memory transistor MTr on is at a high level.

Erasing data in the memory cell M (n, m) is performed as follows. The X decoder 20 causes the word line $W_n$ to be at a low level, and the Y decoder 21 applies erasing voltage $V_E$ (e.g., 12 V) to the bit line $B_m$. The Y decoder 21 applies a ground potential to the bit line $B_{m+1}$ and the source line $S_{m+1}$ or causes these bit lines to be in disconnection so as to prevent erasing in the memory cell M (n, m+1) which, commonly to the memory cell M (n, m), is connected to the word line $W_n$. As to the remaining memory cells M (n+1, m) and M (n+1, m+1), the X decoder 20 causes the word line $W_{n+1}$ to be at a high level so as to prevent erasing in those memory cells.

Setting the common gate 10a of the memory cell M (n, m) at low level and applying the erasing voltage $V_E$ to the drain diffusion layer 11, electrons accumulated in the floating gate 7a are pulled out into the drain diffusion layer 11, passing through the tunnel oxide film 6, and thus, erasing of the stored data is effected. In such a erasing situation, the threshold to turn the memory transistor MTr on is at a low level.

Reading data stored in the memory cell M (n, m) is performed as follows: The Y decoder 21 applies the ground potential to the source line $S_m$, and the X decoder 20 applies the sense voltage $V_{SENSE}$ (e.g., 5 V) to the word line $W_n$. Then, the Y decode 21 applies voltage Vcc via a resistance (not shown) to the bit line $B_m$. At this time, the data detecting circuit 22 detects whether a potential at the bit line $B_m$ drops. If data is written in the memory cell M (n, m), the memory transistor MTr turns off, and therefore, no voltage drop arise; that is, data "1" is read out. On the contrary, if data is not written in the memory cell M (n, m), the memory transistor MTr turns on, and therefore, a voltage drop arises; that is, data "0" is read out. The sense voltage $V_{SENSE}$ stated above is a voltage of a medium level between threshold levels of the memory transistor in its writing and erasing states.

As has been described, in this embodiment, a gate shaped like a sidewall along a side of the gate of the select transistor STr is used as the floating gate 7a, and a part close to the source provided across a relatively large area above the channel region and having a large cross-sectional area in the common gate 10a, is used as a gate of the select transistor STr. Thus, since the gate of the select transistor STr has a sufficiently small resistance, the select transistor STr can be well driven. This allows the high speed reading of data.

Although the cross-sectional area of the floating gate 7a is small because the gate formed like a sidewall is used as the floating gate 7a, it is simply used for an accumulation of electric charges, and no voltage is externally applied to the floating gate 7a. Hence, even if the floating gate 7a having a small cross-sectional area has a large resistance value, this exerts no adverse effect upon the erasing and reading operations.

Moreover, since two transistors, the memory transistor MTr and the select transistor STr, are formed in a single transistor formation region, the area of the memory cell is never excessively increased, and a high degree of integration can be well attained.

Figure 5:
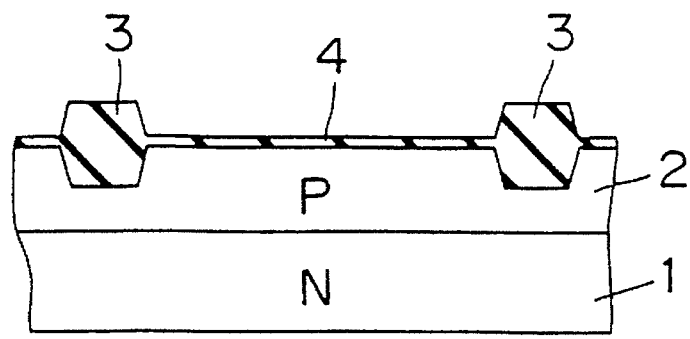
FIGS. 5(a) through 5(d) are sectional views illustrating processes for manufacturing the EEPROM of the second preferred embodiment in order.
Figure 5:
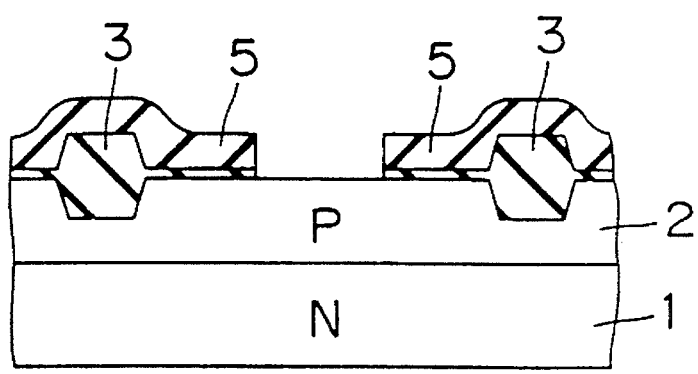
Figure 5:
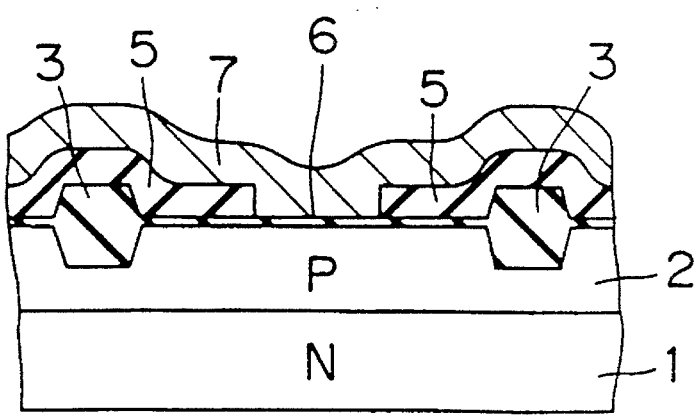
Figure 5:
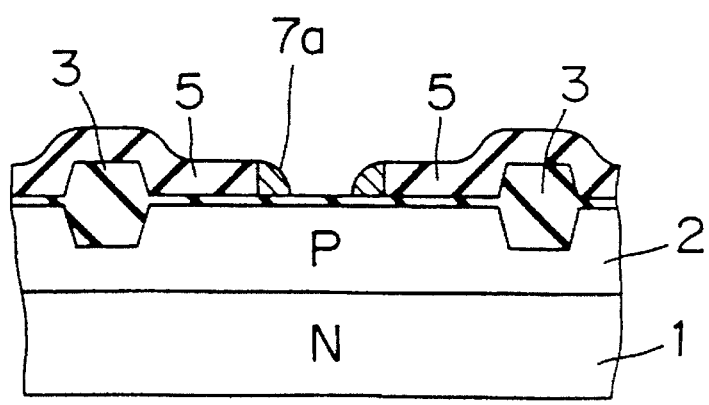
Figure 6:
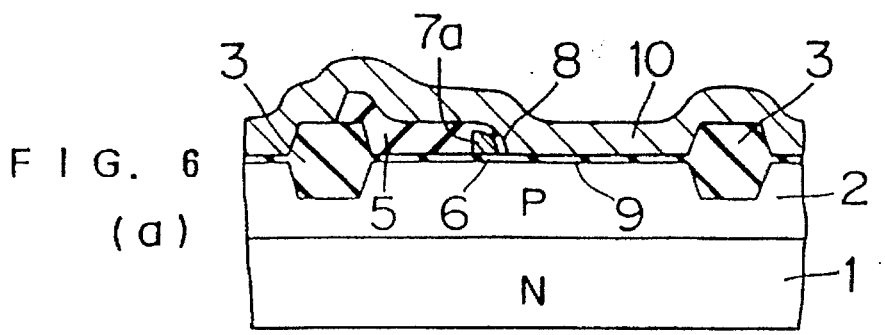
FIGS. 6(a) through 6(d) are sectional views illustrating processes following a process of FIG. 5(d) in order.
Figure 6:
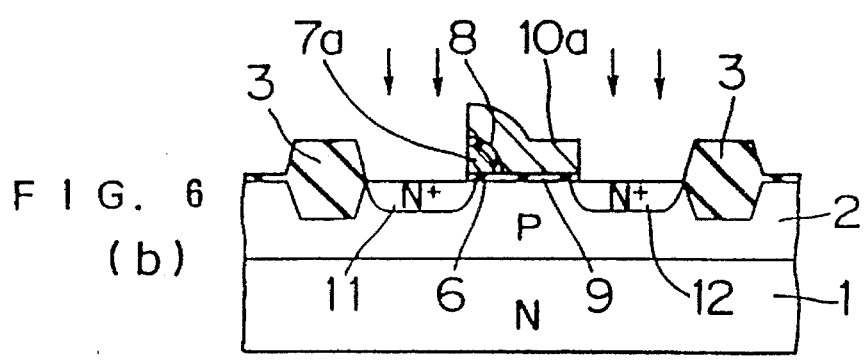
Figure 6:
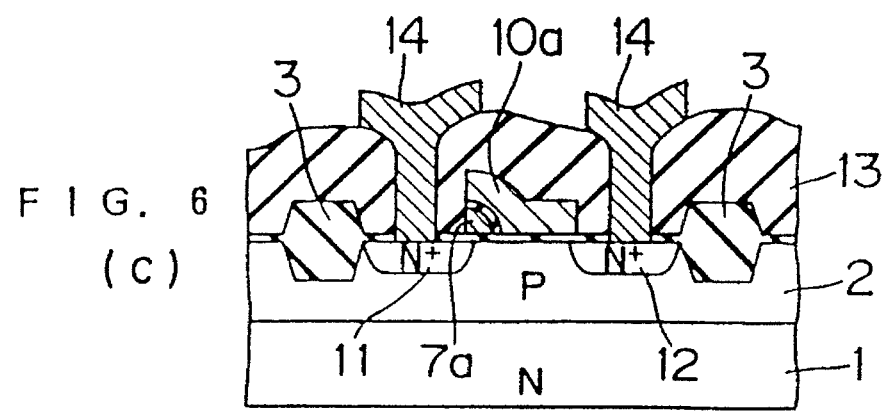
Figure 6:
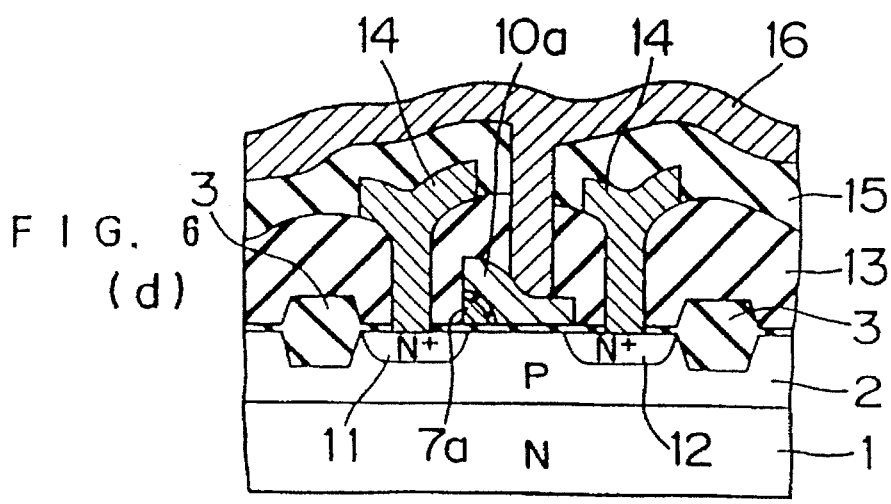

Referring to FIGS. 5 and 6, a method of manufacturing the EEPROM of this embodiment will now be described. There are variation and modifications of the manufacturing method, and it is not intended that a memory device of this invention be limited to those which are manufactured according to the method.

First, as shown in FIG. 5(a), a P-well 2 is formed in an N-type silicon substrate 1. After that, an oxide film 4 is formed over a surface, and then an element isolating field oxide film 3 is selectively grown.

Then, as shown in FIG. 5(b), after an oxide film 5 is deposited by means of chemical vapor deposition (CVD), the oxide film 5 in a region where a memory transistor and a select transistor are to be formed is selectively removed by means of anisotropic etching.

Then, the surface of the substrate is oxidized again to flatten the surface, and thereafter, the resulting oxide film is removed by means of wet etching. Then, a tunnel oxide film 6 is formed in an element formation region, a conductive polysilicon film 7 is deposited. An eventual situation is shown in FIG. 5(c).

Then, as shown in FIG. 5(d), the surface is etched back till the polysilicon film 7 on the oxide film 5 is thoroughly removed. In this way, a sidewall of polysilicon is formed on a side of a through hole defined by the oxide film 5. The sidewall on the left in FIG. 5(d) is to be the previously mentioned floating gate 7a of the memory transistor MTr. A gate length of the floating gate 7a is controllable in accordance with dimensions under the design rule by changing the thickness of the oxide film 5 and etching conditions and the like.

Referring to FIG. 6(a), masking the floating gate 7a formed of the left sidewall shown in FIG. 5(d) and part of the oxide film 5 with photoresist, the right sidewall and the remaining oxide film 5 are etched away. After the photoresist is removed, thermal oxidation performed to make an insulating film (silicon oxide film) 8 on a surface of the floating gate 7a. After the oxide film in the region where the select transistor is to be formed is removed by means of wet etching, a gate oxide film 9 is formed, and then, a polysilicon film 10 is formed.

Then, as shown in FIG. 6(b), masking the transistor formation region with photoresist, the polysilicon film 10 and the oxide film 5 in part are removed by means of anisotropic etching. As a result, the common gate 10a which acts as both a control gate of the memory transistor and a gate of the select transistor is formed. After the oxide film 9 in drain and source formation regions is removed, N-type impurity ions of phosphorus or arsenic or the like are implanted to form a drain diffusion layer 11 and a source diffusion layer 12.

Further, as shown in FIG. 6(c), thermal oxidation is performed again to make an oxide film on a surface. Then, a layer insulating film 13 of phosphorus glass (PSG), for example, is deposited, and thereafter, contact holes are formed in the drain and source formation regions, and metal such as Al-Si is deposited to form a metal film. The metal film is patterned by means of photo etching to make metal wiring electrically connected to the drain diffusion layer 11 and the source diffusion layer 12.

Then, as shown in FIG. 6(d), after a layer insulating film 15 is deposited, a contact hole is formed in the gate formation region, and a metal layer is deposited. Patterning the metal layer, a metal wiring 16 connected to the common gate 10a is formed. In this way, the EEPROM as illustrated in FIGS. 2 and 3 is fabricated.

This embodiment may be modified as follows. For example, while the above mentioned embodiment has been described in conjunction with an N channel EEPROM, this embodiment may be applied to a P channel EEPROM.

Figure 13:
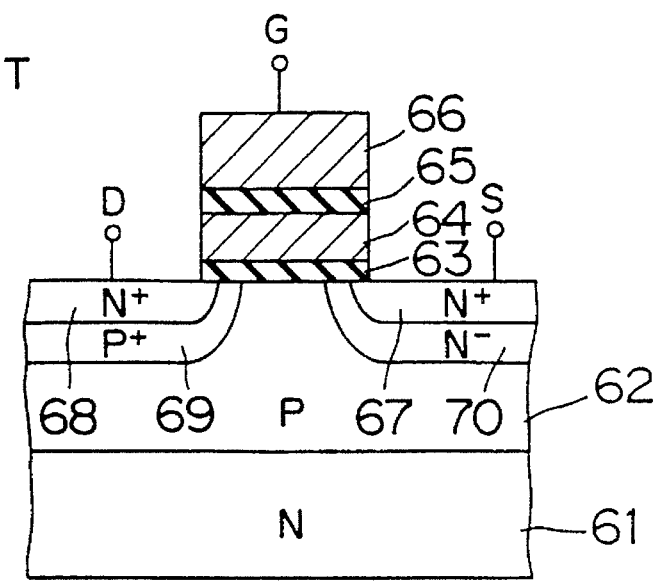
FIG. 13 is a sectional view showing a cell configuration of a stack gate structure flash type EEPROM conventionally used.
Figure 14:
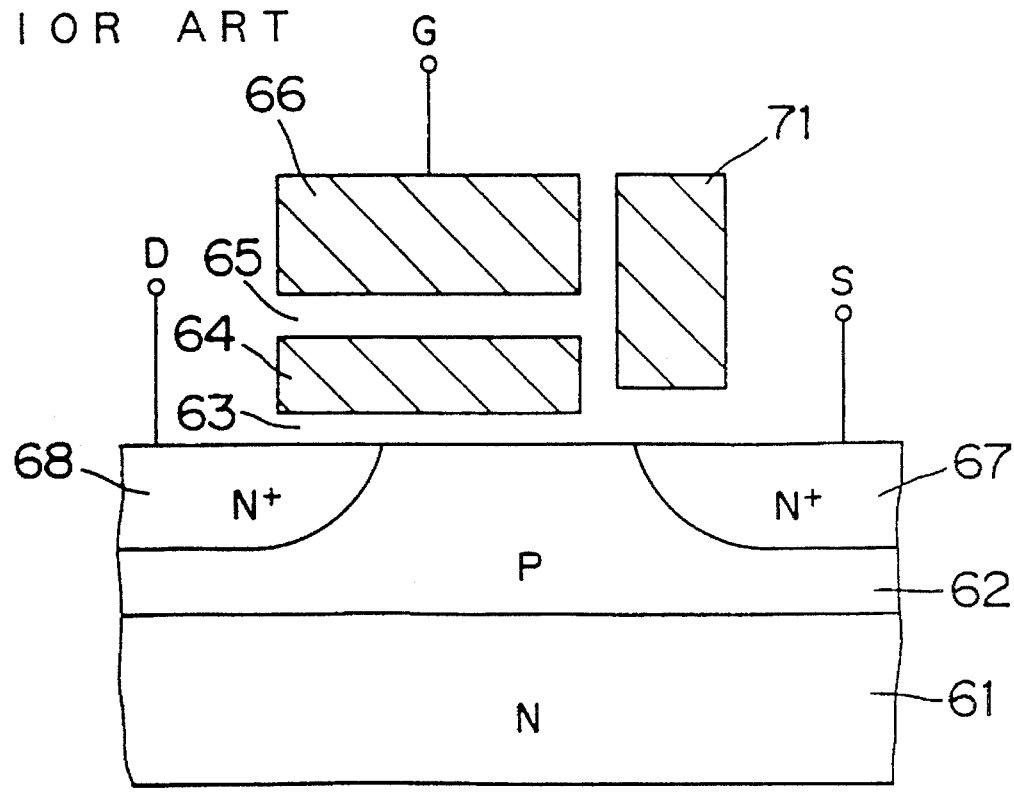
FIG. 14 is a sectional view showing a cell configuration of a prior art SISOS structure flash type EEPROM.
Figure 15:
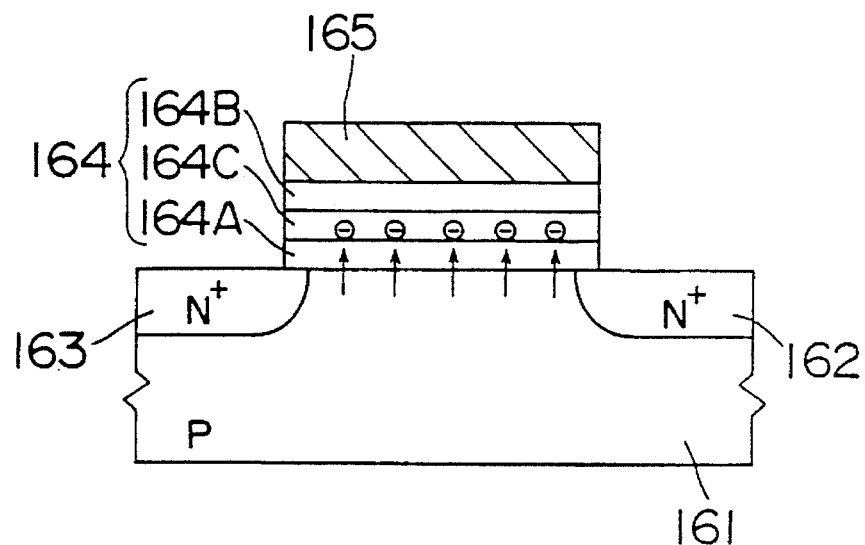
FIG. 15 is a sectional view showing a cell configuration of a stack gate structure EEPROM conventionally used.
Figure 16:
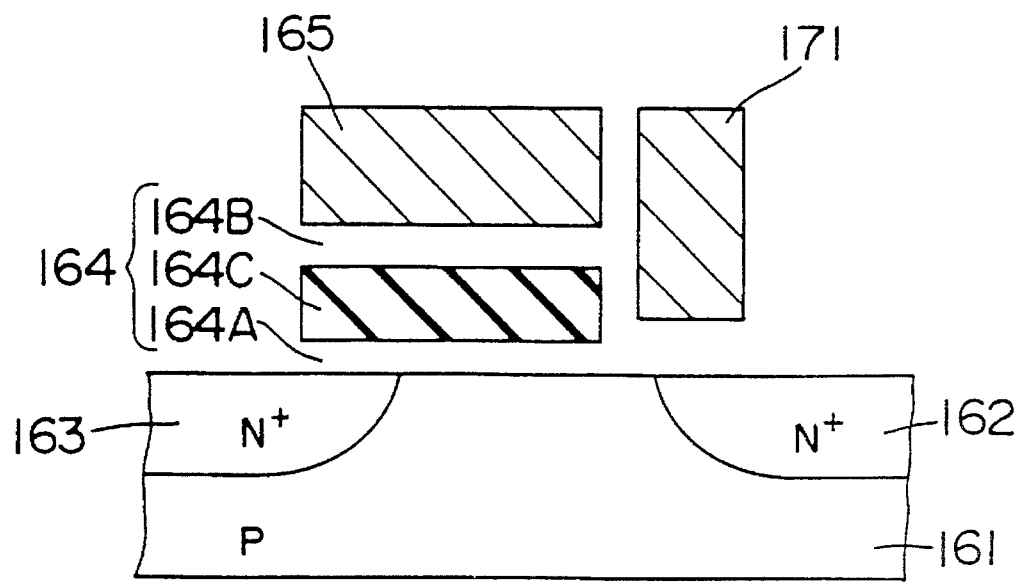
FIG. 16 is a sectional view showing an example where the SISOS structure is applied to a trap-type memory transistor.

Also, as described in conjunction with the prior art embodiment shown in FIG. 13, a $P^+$-type diffusion layer to enhance hot electron producing efficiency may be provided between the drain diffusion layer 11 and the P-well 2 in a memory cell shown in FIG. 2. Furthermore, to enhance the sustain voltage, an $N^-$-type diffusion layer may be provided between the source diffusion layer 12 and the P-well 2.

Although, in the above embodiment, the memory transistor and the select transistor share the single common gate 10a as their respective control gate and gate, these gates may be two individual gates insulated from each other as shown in FIG. 1.

Figure 7:
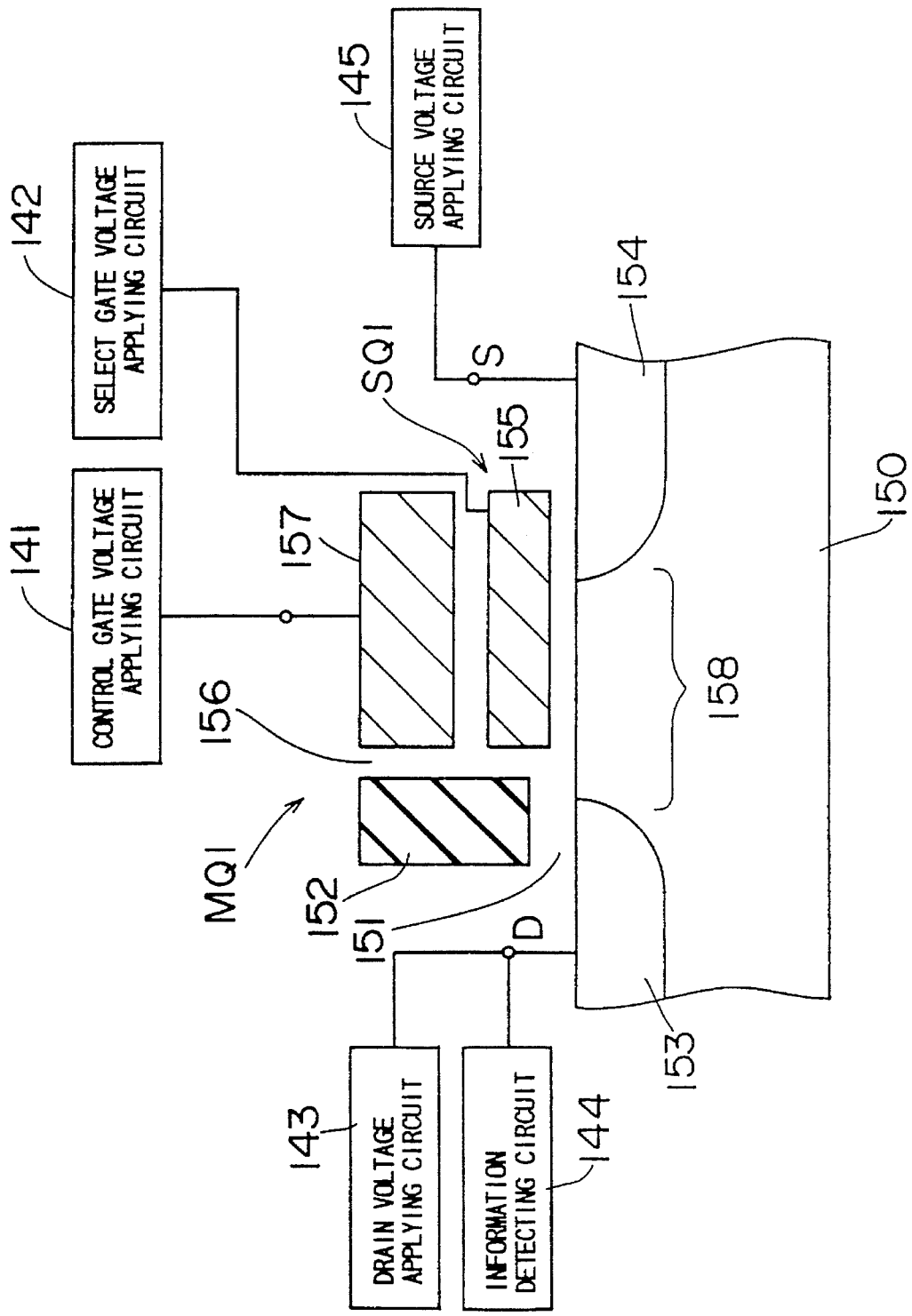
FIG. 7 is a schematic sectional view showing a structure base upon the theory of a nonvolatile memory device of a third preferred embodiment according to the present invention.

FIG. 7 is a sectional view showing a structure based upon the theory of a nonvolatile semiconductor memory device of a third preferred embodiment according to the present invention. On a semiconductor substrate 150 there are provided two transistors: a memory transistor MQ1 for storing data in a nonvolatile manner by injecting/releasing electric charges via a tunnel insulating film 151 into/from an insulating film for holding electric charge, and a select transistor SQ1 for selecting the memory transistor MQ1. In the semiconductor substrate 150, a first impurity diffusion region 153 and a second impurity diffusion region 154 are formed with a channel region 158 interposed therebetween, and the first and second impurity diffusion regions 153 and 154 act as a drain D and a source S for both the memory transistor MQ1 and the select transistor SQ1.

On the channel region 158 of the semiconductor substrate 150, a select gate 155 of the select transistor SQ1 is formed. A sidewall structure in the form of a sidewall spacer 152, acting as the electric charge holding insulating film, is provided along a side of the select gate 155 close to the drain.

In the vicinity of the sidewall spacer 152, a control gate 157 of the memory transistor MQ1 is provided with an insulating film 156 interposed between them.

The control gate 157 is connected to a control gate voltage applying circuit 141 while the select gate 155 is connected to a select gate voltage applying circuit 142. The first impurity diffusion region 153 is connected to a drain voltage applying circuit 143 and a data detecting circuit 144. The second impurity diffusion region 154 is connected to a source voltage applying circuit 145.

It is now assumed that the semiconductor substrate 150 is of a P-type and the first and second impurity diffusion regions 153 and 154 are of an $N^+$-type. If electrons are retained in the sidewall spacer 152, an inversion layer does not easily appear in a surface of the semiconductor substrate 150 just below the sidewall spacer 152. This state, for example, corresponds to a logic "1". If electrons are not retained in the sidewall spacer 152, an inversion layer appears relatively easily in the surface of the semiconductor substrate 150 just below the sidewall spacer 152. This state, for example, corresponds to a logic "0".

In writing data, the control gate voltage applying circuit 141 applies a high level voltage (e.g., 12 V) to the control gate 157, and the select gate voltage applying circuit 142 applies a high level voltage (e.g., 12 V) to the select gate 155. The drain voltage applying circuit 143 applies positive writing voltage Vp (e.g., 5 V) to the first impurity diffusion region 153, and the source voltage applying circuit 145 applies a ground potential to the second impurity diffusion region 154.

Thus, electrons from the impurity diffusion region 154 are accelerated toward the impurity diffusion region 153. Hot electrons produced in the vicinity of the sidewall spacer 152 are injected into the sidewall spacer 152. Thus, the writing of the data "1" is effected.

The writing voltage Vp is preferably selected to have a level at which a channel formed in a channel region 158 extends beyond under the select gate 155 to a position which does not reach the first impurity diffusion region 153. Then, an electric field is concentrated in a region just under the sidewall spacer 152, and numerous hot electrons are produced. This allows the high speed writing of data.

In erasing data, the control gate voltage applying circuit 141 applies a low level voltage (e.g., 0 V) to the control gate 157, and the select gate voltage applying circuit 142 applies a low level voltage (e.g., 0 V) to the select gate 155. The drain voltage applying circuit 143 applies a positive erasing voltage $V_E$ (e.g., 12 V) to the first impurity diffusion region 153.

In this way, electrons in the sidewall spacer 152 are pulled out into the impurity diffusion region 153, passing through the tunnel insulating film 151. Thus, the stored data becomes "0", and the erasing of data is effected.

In reading data, the control gate voltage applying circuit 141 applies a specified sense voltage $V_{SENSE}$ (e.g., 5 V) to the control gate 157. The sense voltage $V_{SENSE}$ allows an inversion layer to appear just under the sidewall spacer 152 when the stored data is "0" while it cannot allow the inversion layer to appear in that portion when the stored data is "1". On the other hand, the select gate voltage applying circuit 142 applies a high level voltage (e.g., 5 V) to the select gate 155 to make an inversion layer in a surface of the semiconductor substrate 150 just below the select gate 155. Moreover, the source voltage applying circuit 145 applies a ground potential to the impurity diffusion region 154.

In this state, the drain voltage applying circuit 143 applies a positive voltage Vcc to the impurity diffusion region 153 while the data detecting circuit 144 detects a drop of a potential at the impurity diffusion region 153. If the stored data is "1", a path between the pair of the impurity diffusion regions 153 and 154 is interrupted, and therefore, a potential at the impurity diffusion region 153 does not change. On the other hand, if the stored data is "0", a path between the pair of the impurity diffusion regions 153 and 154 is conductive, the potential at the impurity diffusion region 153 drops to the ground potential applied to the impurity diffusion region 154. Thus, by making the data detecting circuit 144 monitor the drop of the potential at the impurity diffusion region 153, the reading of the stored data is effected.

As mentioned above, in the memory device in this embodiment, the select gate 155 of the select transistor SQ1 is formed in a relatively large area above the channel region 158, and the sidewall spacer 152 on one side of the gate 155 functions as the insulating film for holding electric charge. Thus, the select gate 155 to which a voltage for selecting the memory transistor MQ1 is applied, has a relatively large cross-sectional area, and therefore, it can have a sufficiently small resistance value. Thus, high speed reading can be effected.

Additionally, two transistors, the memory transistor and the select transistor, are formed in a single transistor formation region. This allows a memory device to be formed in a region of a small area, and it is advantageous for production of highly integrated devices.

On the other hand, the sidewall spacer 152 is formed narrow in width along a side of the select gate 155, and when hot electrons or hot holes are produced in the vicinity of the first impurity diffusion region 153 corresponding to a drain, the hot electrons or the hot holes are trapped uniformly in the sidewall spacer 152. Thus, injection of hot electrons or hot holes permits the threshold of the memory transistor to change in sufficiently large range. As a result that stable storage can be effected by the injection of hot electrons or hot holes, the tunnel insulating film 151 is made thicker, and thus, dissipation of electric charge can be effectively prevented to retain stored data well.

Figure 8:
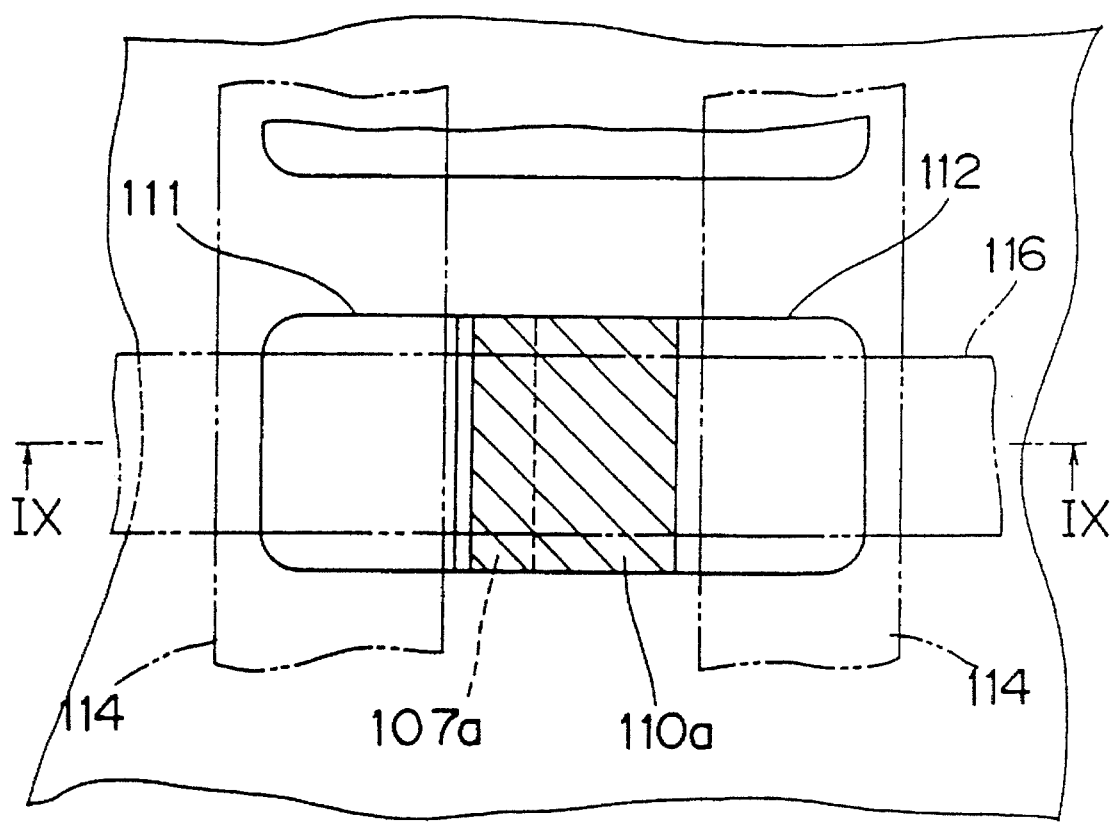
FIG. 8 is a plan view showing a cell configuration of an EEPROM of a fourth preferred embodiment according to the present invention.
Figure 9:
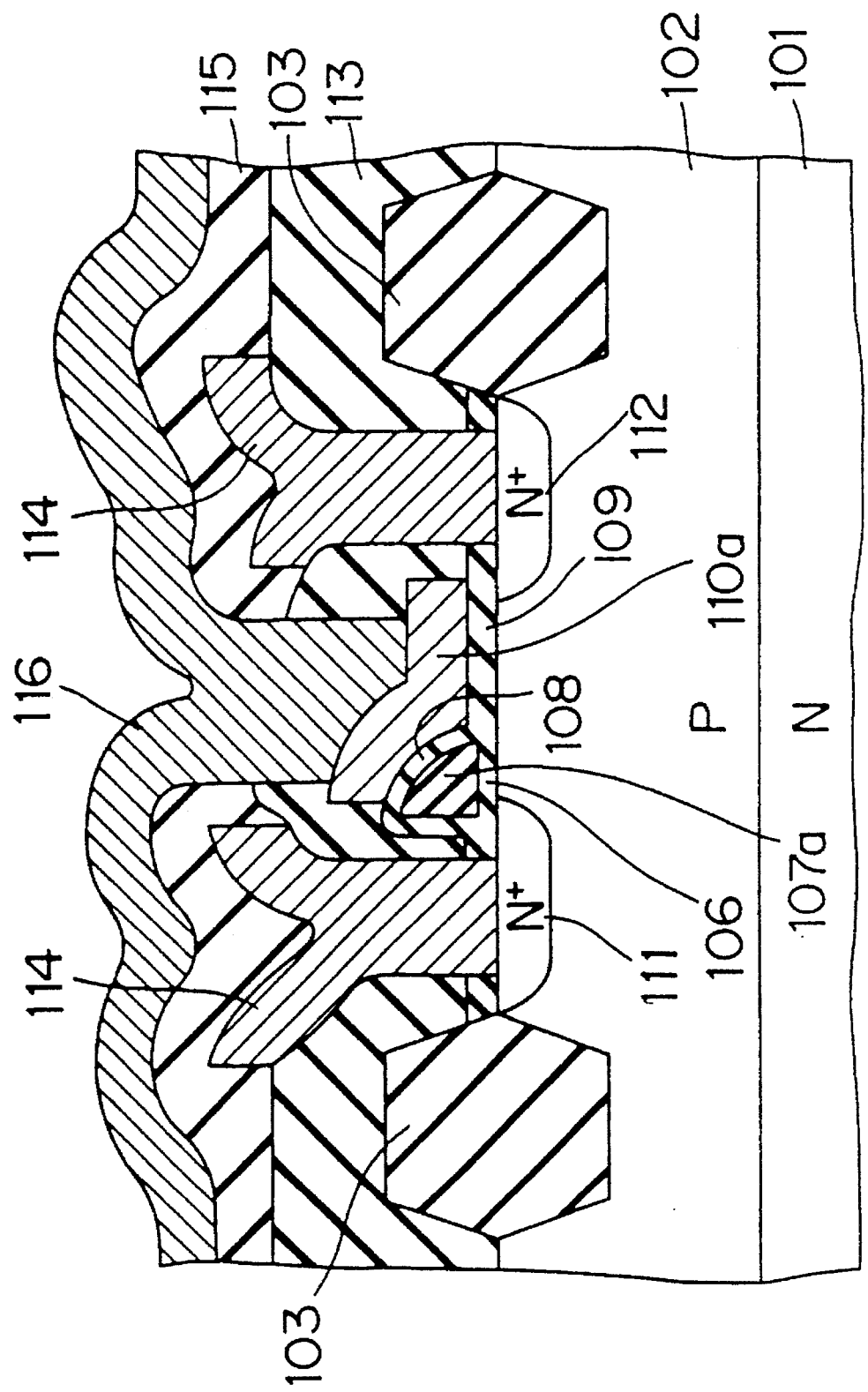
FIG. 9 is a sectional view taken along the line IX—IX of FIG. 8.

FIG. 8 is a plan view of a memory cell of an EEPROM of a fourth preferred embodiment of a nonvolatile semiconductor memory device according to the present invention, and FIG. 9 is a sectional view taken along the line IX—IX of FIG. 8. A P-well 102 formed in an N-type silicon substrate 101 is separated in parts corresponding to specified element formation regions by a field oxide film 103. In each of the separated element formation regions, an $N^+$-type drain diffusion layer 111 and an $N^+$-type source diffusion layer 112.

In the channel region between the drain diffusion layer 111 and the source diffusion layer 112, a long and narrow sidewall spacer 107a acting as an insulating film for holding electric charge is formed in the vicinity of the drain diffusion layer 111, with a tunnel oxide film 106 interposed between the channel region and the floating gate 107a. The sidewall spacer 107a is, for example, formed of polysilicon film. In an area of the channel region close to a source, a common gate 110a is formed on a gate oxide film 109 superposed upon the channel region, and the common gate 110a extends up to a region above the sidewall spacer 107a, with an insulating film 108 interposed between them.

In FIGS. 8 and 9, the nonvolatile semiconductor memory device further includes a metal wiring 114 electrically connected to the drain diffusion layer 111 and the source diffusion layer 112, a metal wiring 116 electrically connected to a common gate 110a, and layer insulating films 113 and 115.

In this embodiment, a single memory cell includes a memory transistor and a select transistor in a single transistor region. Specifically, the drain diffusion layer 111 and the source diffusion layer 112 act as a drain and a source for each of those transistors. A gate of the memory transistor consists of the above-mentioned tunnel oxide film 106, the sidewall spacer 107a, the insulating film 108 and the common gate 110a, and one side potion of the common gate 110a close to the drain serves as a control gate. The gate of the select transistor (corresponding to a select gate) is formed of the gate oxide film 109 and the other side portion of the common gate 110a close to the source.

Figure 10:
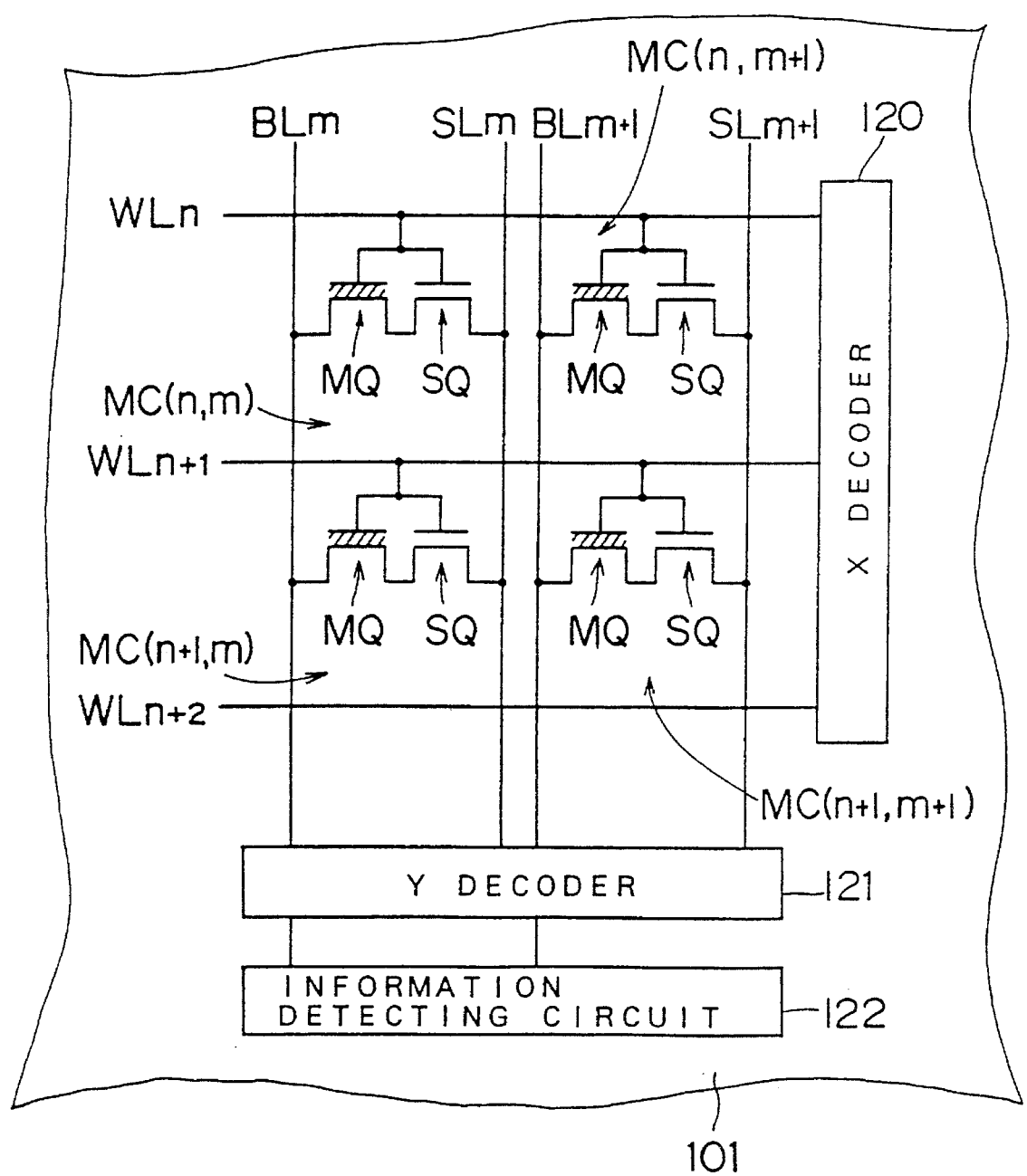
FIG. 10 is an electric circuit diagram partially showing an equivalent circuit of the EEPROM of the fourth preferred embodiment.

FIG. 10 is an electrical circuit diagram partially showing an equivalent circuit of an EEPROM of this embodiment. A single memory cell is comprised of the memory transistor MQ and the select transistor SQ, and such memory cells are arranged in a matrix manner. The common gate 110a for both the transistors MQ and SQ is connected to corresponding one of word lines $WL_n$, $WL_{n+1}$, and $WL_{n+2}$. The memory transistor MQ has its drain (the drain diffusion layer 111) connected to a corresponding one of bit lines $BL_m$ and $BL_{m+1}$, and the select transistor SQ has its source (the source diffusion layer 112) connected to a corresponding one of source lines $SL_m$ and $SL_{m+1}$. The word lines $WL_n$, $WL_{n+1}$ and $WL_{n+2}$ are selected by an X decoder 120, and the source lines $SL_m$ and $SL_{m+1}$ are selected by a Y decoder 121. The bit lines $BL_m$ and $BL_{m+1}$ are selected by the Y decoder 121. Variations in potential of the bit lines $BL_m$ and $BL_{m+1}$ can be monitored by the data detecting circuit 122.

Writing data in a memory cell MC (n, m) is performed as follows. The Y decoder 121 applies writing voltage Vp (e.g., 5 V) to the bit line $BL_m$, and the X decoder 120 applies voltage of high level (e.g., 12 V) to the word line $WL_n$. The Y decoder 121 applies ground potential to the source line $SL_m$. The Y decoder 121 causes the bit lines $BL_{m+1}$ and the source line $SL_{m+1}$ to be in disconnection or applies ground potential to them so as to prevent writing in another memory cell MC (n, m+1) which, commonly to the memory cell MC (n, m), is connected to the word line $WL_n$. As to the remaining memory cells MC (n+1, m) and MC (n+1, m+1), the X decoder 120 applies a ground potential or a voltage of low level (e.g., 0 V) to the word line $WL_{n+1}$ to turn the select transistor SQ off, and thus writing in each memory cell is prevented.

In the selected memory cell MC (n, m), hot electrons are injected into the sidewall spacer 107a as in the following way. The writing voltage $V_P$ is applied to the drain diffusion layer 111, the ground potential is applied to the source diffusion layer 112, and the common gate 110a reaches a high level. At this time a channel is formed from the source diffusion layer 112 toward the drain diffusion layer 111. Appropriately setting the writing voltage $V_P$, the channel extends beyond under the select transistor SQ (i.e., just below the gate oxide film 109 on the right side portion of the common gate 110a in FIG. 9) up to a position which does not reach the drain diffusion layer 111. Then, an electric field is concentrated in a region just under the sidewall spacer 107a, and numerous hot electrons are developed. Although part of the hot electrons flows into the drain diffusion layer 111, another part is accelerated by the electric field in the common gate 110a and injected and trapped into the sidewall spacer 107a after passing through the tunnel oxide film 106. In this way, data writing is effected. In such a writing situation, the threshold to turn the memory transistor MQ on is at a high level.

Erasing data in the memory cell MC (n, m) is performed as follows. The X decoder 120 causes the word line $WL_n$ to be at a low level, and the Y decoder 121 applies erasing voltage $V_E$ (e.g., 12 V) to the bit line $BL_m$. The Y decoder 121 applies ground potential to the bit line $BL_{m+1}$ and the source line $SL_{m+1}$ or causes these bit lines to be in disconnection so as to prevent erasing in the memory cell MC (n, m+1) which, commonly to the memory cell MC (n, m), is connected to the word line $WL_n$. As to the remaining memory cells MC (n+1, m) and MC (n+1, m+1), the X decoder 120 causes the word line $WL_{n+1}$ to be at high level so as to prevent erasing in those memory cells.

Setting the common gate 110a of the memory cell MC (n, m) at low level and applying the erasing voltage $V_E$ to the drain diffusion layer 111, electrons accumulated in the sidewall spacer 107a are pulled out into the drain diffusion layer 111, passing through the tunnel oxide film 106, and thus, the erasing of the stored data is effected. In such an erasing situation, the threshold to turn the memory transistor MQ on is at a low level.

Reading data stored in the memory cell MC (n, m) is performed as follows: The Y decoder 121 applies the ground potential to the source line $SL_m$, and the X decoder 120 applies the sense voltage $V_{SENSE}$ (e.g., 5 V) to the word line $WL_n$. Then, the Y decoder 121 applies voltage Vcc via a resistance (not shown) to the bit line $BL_m$. At this time, the data detecting circuit 122 detects whether a potential at the bit line $BL_m$ drops. If data is written in the memory cell MC (n, m), the memory transistor MQ turns off, and therefore, no voltage drop arises; that is, data "1" is read out. On the contrary, if data is not written in the memory cell MC (n, m), the memory transistor MQ turns on, and therefore, voltage drop arises; that is, data "0" is read out. The sense voltage $V_{SENSE}$ stated above is a voltage of a medium level between threshold levels of the memory transistor MQ in its writing and erasing states.

As has been described, in this embodiment, the sidewall spacer 107a provided along a side of the gate of the select transistor SQ is used as an insulating film for holding electric charge, and a part close to the source, provided across a relatively large area above the channel region and having a large cross-sectional area in the common gate 110a, is used as a gate of the select transistor SQ. Thus, since the gate of the select transistor SQ has a sufficiently small resistance, the select transistor SQ can be well driven. This allows high speed reading of data.

Furthermore, the sidewall spacer 107a formed narrow in width is used as an insulating film for holding electric charge in the memory transistor MQ, and therefore, hot electrons locally produced in a border region of the drain diffusion layer 111 can be trapped uniformly throughout the sidewall spacer 107a. This allows the threshold to turn the memory transistor MQ on to change greatly, and consequently, stable data storage can be attained. Moreover, since the data writing is performed by injecting hot electrons, the tunnel oxide film 106 can be formed sufficiently thick, which can effectively prevent dissipation of electric charges trapped in the sidewall spacer 107a, and stored data can be retained well.

Moreover, since two transistors, the memory transistor MQ and the select transistor SQ, are formed in a single transistor formation region, the area of the memory cell is never excessively increased, and a high degree of integration can be well attained.

Figure 11:
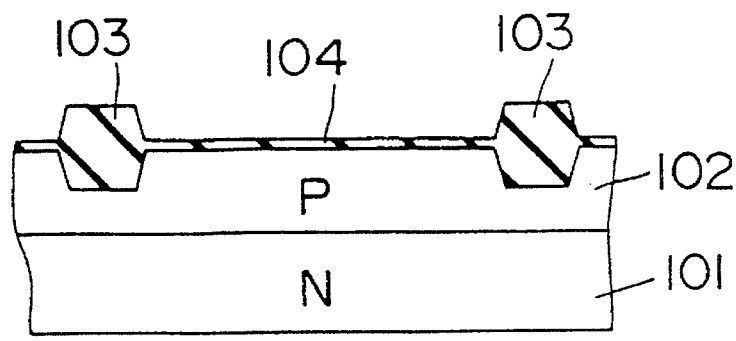
FIGS. 11(a) through 11(d) are sectional views illustrating processes for manufacturing the EEPROM of the fourth preferred embodiment in order.
Figure 11:
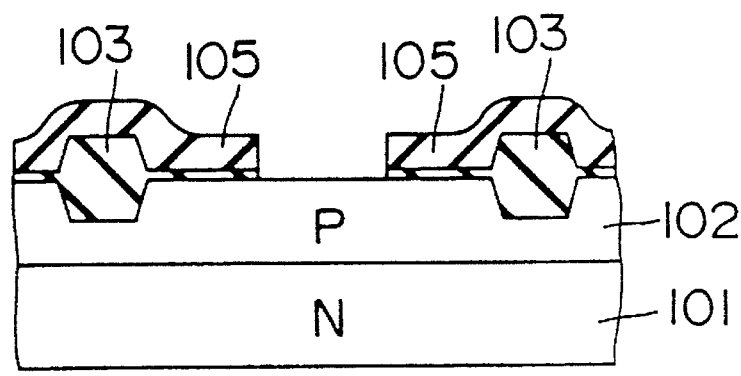
Figure 11:
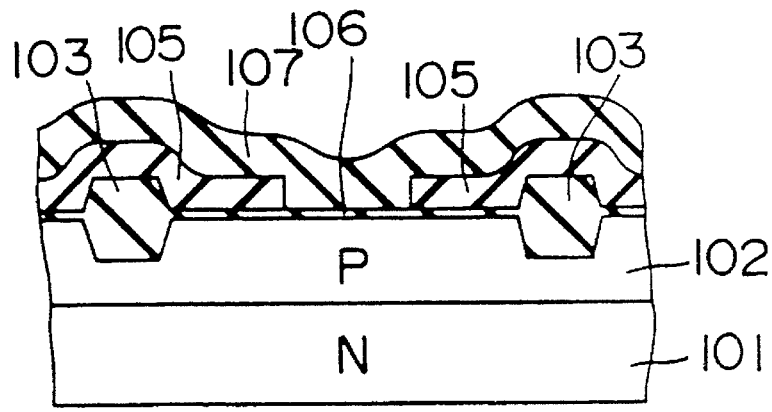
Figure 11:
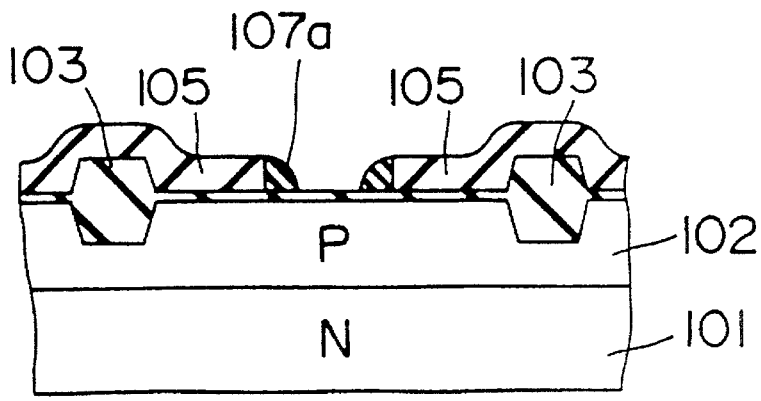
Figure 12:
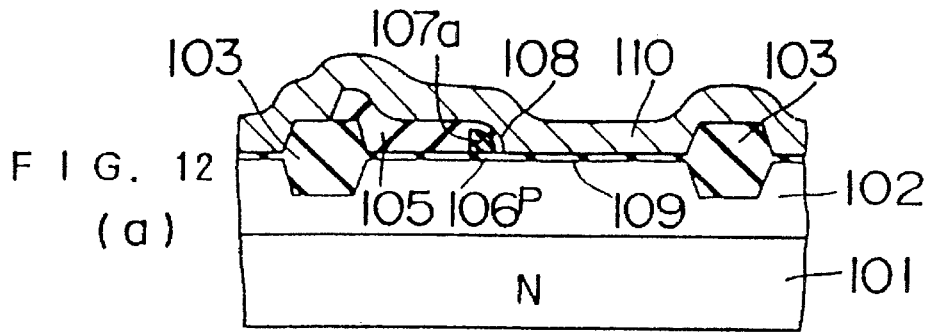
FIGS. 12(a) through 12(d) are sectional views illustrating processes following a process of FIG. 11(d)
Figure 12:
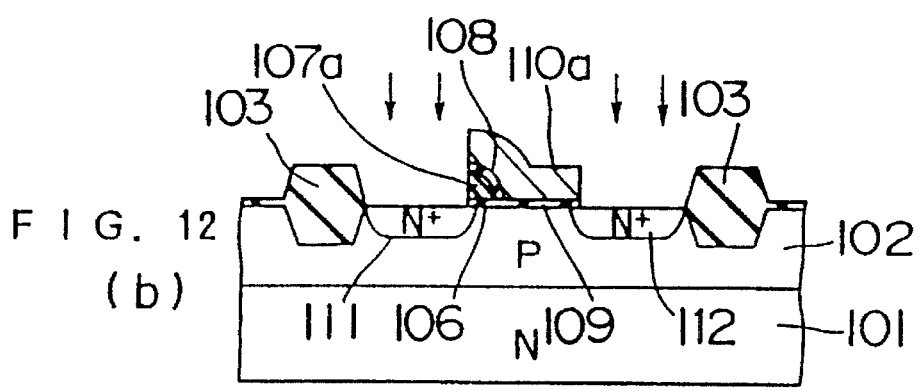
Figure 12:
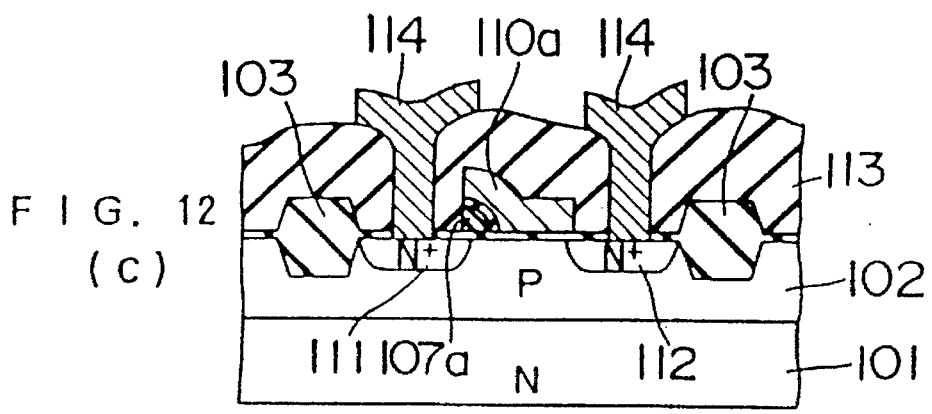
Figure 12:
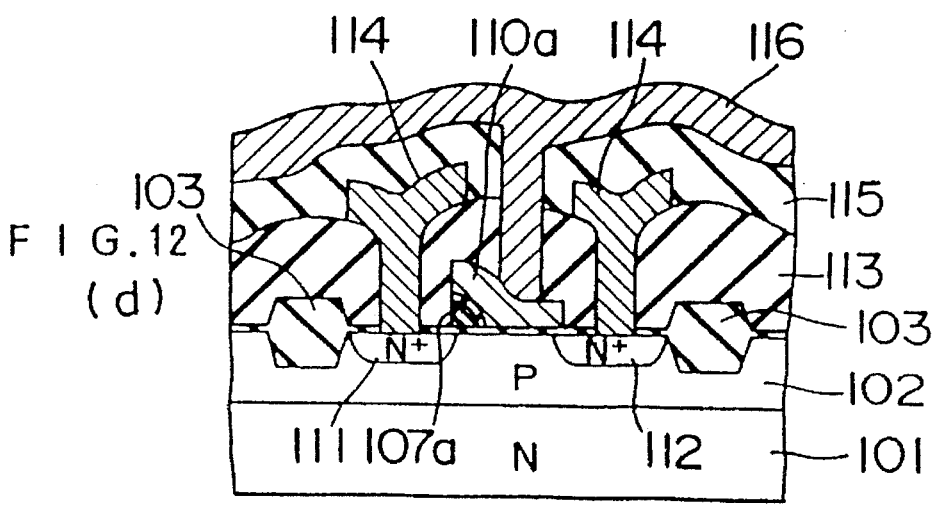

Referring to FIGS. 11 and 12, a method of manufacturing the EEPROM of this embodiment will now be described. There are variation and modifications of the manufacturing method, and it is not intended that a memory device of this invention be limited to those which are manufactured according to the method.

First, as shown in FIG. 11(a), a P-well 102 is formed in an N-type silicon substrate 101. After that, an oxide film 104 is formed over a surface, and then an element isolating field oxide film 103 is selectively grown.

Then, as shown in FIG. 11(b), after an oxide film 105 is deposited by means of chemical vapor deposition (CVD), the oxide film 105 in a region where a memory transistor and a select transistor are to be formed is selectively removed by means of anisotropic etching.

Then, the surface of the substrate is oxidized again to flatten the surface, and thereafter, the resulting oxide film is removed by means of wet etching. Then, a tunnel oxide film 106 is formed in an element formation region, a conductive polysilicon film 107 is deposited. An eventual situation is shown in FIG. 11(c).

Then, as shown in FIG. 11(d), the surface is etched back till the polysilicon film 107 on the oxide film 105 is thoroughly removed. In this way, a side wall of polysilicon is formed on a side of a through hole defined by the oxide film 105. The side wall on the left in FIG. 11(d) is to be the previously mentioned sidewall spacer 107a of the memory transistor MQ. A width of the sidewall spacer 107a in an elongated direction is controllable in accordance with dimensions under the design rule by changing the thickness of the oxide film 105 and etching conditions.

Referring to FIG. 12(a), masking the sidewall spacer 107a which is formed of the left side wall shown in FIG. 11(d) and part of the oxide film 105 with photoresist, the right side wall and the remaining oxide film 105 are etched away. After the photoresist is removed, thermal oxidation is performed to make an insulating film (silicon oxide film) 108 on a surface of the sidewall spacer 107a. After the oxide film in the region where the select transistor is to be formed is removed by means of wet etching, a gate oxide film 109 is formed, and then, a polysilicon film 110 is formed.

Then, as shown in FIG. 12(b), masking the transistor formation region with photoresist, the polysilicon film 110 and the oxide film 105 in other part are removed by means of anisotropic etching. As a result, the common gate 110a which acts as both a control gate of the memory transistor and a gate of the select transistor is formed. After the oxide film 109 in drain and source formation regions is removed, N-type impurity ions of phosphorus or arsenic or the like are implanted to form a drain diffusion layer 111 and a source diffusion layer 112.

Further, as shown in FIG. 12(c), thermal oxidation is performed again to make an oxide film on a surface. Then, a layer insulating film 113 of phosphorus glass (PSG), for example, is deposited, and thereafter, contact holes are formed in the drain and source formation regions, and metal such as Al-Si is deposited to form a metal film. The metal film thus formed is patterned by means of photo etching to make metal wiring electrically connected to the drain diffusion layer 111 and the source diffusion layer 112.

Then, as shown in FIG. 12(d), after a layer insulating film 115 is deposited, a contact hole is formed in the gate formation region, and a metal layer is deposited. Patterning the metal layer, a metal wiring 116 connected to the common gate 110a is formed. In this way, the EEPROM as illustrated in FIGS. 8 and 9 is fabricated.

This embodiment may be modified as follows: For example, while the above mentioned embodiment has been described in conjunction with an N channel EEPROM, this embodiment may be applied to a P channel EEPROM.

In addition to that, a $P^+$-type diffusion layer for enhancing a hot electron producing efficiency may be provided between the drain diffusion layer 111 and the P-well 102. Moreover, to enhance sustain voltage, an $N^-$-type diffusion layer may be provided between the source diffusion layer 112 and the P-well 102.

Although, in the above embodiment, the memory transistor and the select transistor share the single common gate 110a as their respective control gate and gate, these gates may be two individual gates insulated from each other as shown in FIG. 7.

While the preferred embodiments of the present invention have been described in detail, they are simply examples used for set forth technical subjects of the present invention, and the present invention should not be limited to these embodiments nor be taken in a narrow sense. The true spirit and scope of the present invention should be defined only by the appended claims.

What is claimed is:

1. A nonvolatile semiconductor memory device, comprising a pair of impurity regions, including an impurity region for a source and an impurity region for a drain, formed in a semiconductor substrate at a specified interval;

a channel region between said pair of impurity regions, in the semiconductor substrate;

a select gate formed over said channel region, said select gate having a side close to the drain;

a sidewall structure for holding electric charge, provided along the side of said select gate close to the drain;

a sidewall insulating film covering said sidewall structure;

a tunnel insulating film, interposed between said sidewall structure and said channel region; and a control gate disposed in a vicinity of said sidewall structure, said sidewall insulating film being interposed between said control gate and said sidewall structure.

2. A nonvolatile semiconductor memory device according to claim 1, wherein said sidewall structure is conductive and functions as a floating gate.

3. A nonvolatile semiconductor memory device according to claim 1, wherein said sidewall structure is an insulating film which can trap electric charge.

4. A nonvolatile semiconductor memory device according to claim 1, wherein said select gate and said control gate are connected to each other and form a unity common gate.

5. A nonvolatile semiconductor memory device according to claim 4, wherein said common gate is formed, extending up to a region above said sidewall structure.

6. A nonvolatile semiconductor memory device according to claim 1, further comprising (A) writing control means including
  (a) means for applying a specified writing voltage between said impurity region for a source and said impurity region for a drain;
  (b) means for applying voltage to said select gate to form a channel in said channel region just below said select gate;
  (c) means for applying to said control gate voltage by which electric charge in said semiconductor substrate can be pulled into said sidewall structure; and
  (d) means for generating hot carriers in said semiconductor substrate in the vicinity of said impurity region for a drain, so that said hot carriers can be injected into said sidewall structure, passing through said tunnel insulating film;

(B) erasing control means, including means for applying a specified erasing voltage between said control gate and the impurity region for a drain, so that electric charge in said sidewall Structure can be pulled out into said impurity region for a drain, passing through said tunnel insulating film; and (C) reading control means including
  (e) means for applying specified voltage to said select gate to form a channel in said channel region just below said select gate;
  (f) means for applying to said control gate a specified sense voltage according to which a channel is produced or not in the channel region just below the sidewall structure depending upon whether there is electric charge in said sidewall structure or not; and
  (g) means for detecting whether a channel from the impurity region for a source to the impurity region for a drain exists or not.

7. A nonvolatile semiconductor memory device according to claim 6, wherein said writing voltage is a voltage by which of the terminates close to the boundary between a region just below said select gate and a region, just below said sidewall structure.

8. A nonvolatile semiconductor memory device, comprising (A) a plurality of memory cells arranged in rows and columns in a matrix manner on a semiconductor substrate, each of which memory cells includes
  (a) a pair of impurity regions, including an impurity region for a source and an impurity region for a drain, formed in the semiconductor substrate at a specified interval;
  (b) a channel region between said pair of impurity regions in said semiconductor substrate;
  (c) a select gate formed over said channel region;
  (d) a sidewall structure, for holding electric charge, provided along a side of said select gate close to the drain;
  (e) an insulating film covering said sidewall structure;
  (f) a tunnel insulating film, interposed between said sidewall structure and said channel region; and
  (g) a control gate, disposed in a vicinity of said sidewall structure, the insulating film being interposed between said control gate and said sidewall structure;

(B) for each row, a first word line connected to said select gate of every memory cell aligned in the row;

(C) for said each row, a second word line connected to the control gate of said every memory cell aligned in the row;

(D) for each column, a source line connected to the impurity region for a source of every memory cell aligned in the column;

(E) for said each column, a bit line connected to the impurity region for a drain of said every memory cell aligned in the column;

(F) means for selecting any memory cell in the matrix;

(G) means for, in writing information in the selected memory cell, applying to said first word line connected to the selected memory cell voltage by which a channel is formed in the channel region just below said select gate;

(H) means for, in writing information in the selected memory cell, applying to the second word line connected to the selected memory cell voltage by which electric charge appearing in the channel region is pulled from said sidewall;

(I) means for, in writing information in the selected memory cell, applying between the source line and the bit line connected to the selected memory cell a specified writing voltage by which hot carriers are generated in the channel region just below said sidewall structure;

(J) means for, in erasing information from the selected memory cell, applying between said bit line and said second word line connected to the selected memory cell a specified erasing voltage by which electric charge held in the sidewall structure is pulled out into the impurity region for a drain;

(K) means for, in reading information stored in the selected memory cell, applying to said first word line connected to the selected memory cell voltage by which the channel is formed in the channel region just below said select gate;

(L) means for, in reading information stored in the selected memory cell, applying to said second word line connected to the selected memory cell a specified sense voltage according to which a channel is produced or not in the channel region just below said sidewall structure depending upon whether there is electric charge in said sidewall structure or not; and (M) information detecting means for, in reading information stored in the selected memory call, detecting whether a channel from said impurity region for a source to said impurity region for a drain in the selected memory cell exists or not.

9. A nonvolatile semiconductor memory device according to claim 8, wherein said information detecting means includes means for, in reading information stored in the selected memory cell, applying a specified first potential to said source line connected to the selected memory cell;

means for, in reading information stored in the selected memory cell, applying a specified second potential different from the first potential, to said bit line connected to the selected memory cell; and means for, in reading information stored in the selected memory cell, detecting variations in potential of said bit line connected to the selected memory cell.

10. A nonvolatile semiconductor memory device according to claim 8, wherein said sidewall structure is conductive and acts as a floating gate.

11. A nonvolatile semiconductor memory device according to claim 8, wherein said sidewall structure is an insulating film which can trap electric charge.

12. A nonvolatile semiconductor memory device according to claim 8, wherein said writing voltage is a voltage by which the channel terminates close to the boundary between a region just below said select gate and a region just below said sidewall structure.

13. A nonvolatile semiconductor memory device according to claim 8, wherein said select gate and said control gate are connected to each other to form a unitary common gate, and the first and second word lines are composed of a common line.

14. A nonvolatile semiconductor memory device according to claim 13, wherein said common gate is formed, extending up to a region above said sidewall structure.

15. A nonvolatile semiconductor memory device according to claim 8, wherein each memory cell further comprises an insulating layer interposed between said select gate and said control gate.

16. A nonvolatile semiconductor memory device according to claim 8, wherein said sidewall structure is provided only along said side of said select gate close to said drain.

17. A nonvolatile semiconductor memory device according to claim 1, further comprising an insulating layer interposed between said select gate and said control gate.

18. A nonvolatile semiconductor memory device according to claim 1, wherein said sidewall structure is provided only along said side of said select gate close to said drain.

19. A nonvolatile semiconductor memory device according to claim 1, wherein said sidewall structure comprises means for retaining electrical charges without an external application of a voltage thereto.

20. A nonvolatile semiconductor memory device, comprising a semiconductor substrate;

first and second impurity regions, formed in said semiconductor substrate at a specified interval, one of said first and second impurity regions being a source region and the other of said first and second impurity regions being a drain region;

a channel region in said substrate between said first and second impurity regions, said channel region having a first channel portion adjacent to said first impurity region and a second channel portion between said first channel portion and said second impurity region;

a select gate formed over said second channel portion to control the conductivity of said second channel portion;

a sidewall structure means for selectively holding an electric charge, said sidewall structure means being disposed over said first channel portion and adjacent to a side of said select gate;

a tunnel insulating film, interposed between said sidewall structure and said channel region;

a control gate to selectively control the conductivity of said first channel portion though said sidewall structure means in response to a read voltage applied to said control gate, wherein application of the read voltage to said control gate is effective or ineffective to control the conductivity of said first channel region depending on whether or not said sidewall structure means is holding an electric charge; and a sidewall insulating film interposed between said sidewall structure and both said select gate and said control gate.

21. A nonvolatile semiconductor memory device, comprising a semiconductor substrate;

a pair of impurity regions, including an impurity region for a source and an impurity region for a drain, formed in said semiconductor substrate at a specified interval;

a channel region between said pair of impurity regions, in said semiconductor substrate, said channel region having a first channel portion adjacent to said impurity region for a drain and a second channel portion between said first channel portion and said impurity region for a source;

a first controlling means, including a select gate formed over said channel region, for controlling the conductivity of said second channel portion, said select gate having a side close to said impurity region for a drain;

a sidewall structure for holding an electric charge, provided along said side of said select gate;

a tunnel insulating film, interposed between said sidewall structure and said channel region;

a second controlling means, including a control gate disposed in a vicinity of said sidewall structure, said second controlling means being responsive to a read voltage applied to said control gate, for controlling the conductivity of said first channel portion though said sidewall structure, wherein application of the read voltage to said control gate is effective or ineffective to control the conductivity of said first channel region depending on whether or not said sidewall structure is holding an electric charge film; and a sidewall insulating film interposed between said sidewall structure and both said select gate and said control gate.

22. A nonvolatile semiconductor memory device according to claim 20, wherein said impurity region for a source, said impurity region for a drain, said control gate and said select gate are responsive to first specified voltages applied thereto to generate hot carriers in said semiconductor substrate in said vicinity of said impurity region for a drain, so that the hot carriers are injected into said sidewall structure, passing through said tunnel insulating film.

23. A nonvolatile semiconductor memory device according to claim 22, wherein said impurity region for a source, said impurity region for a drain, said control gate and said select gate are responsive to second specified voltages applied thereto to draw electric charge from said sidewall structure into said impurity region for a drain, passing through said tunnel insulating film.

24. A nonvolatile semiconductor memory device according to claim 23, wherein said the read voltage has a value intermediate of the first and second specified voltages applied to said control gate.

* * * * *